United States Patent
Lin et al.

(10) Patent No.: US 11,942,529 B2
(45) Date of Patent: *Mar. 26, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Chih-Han Lin, Hsinchu (TW); Hsiao Wen Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/834,614

(22) Filed: Jun. 7, 2022

(65) Prior Publication Data

US 2022/0302276 A1    Sep. 22, 2022

Related U.S. Application Data

(63) Continuation of application No. 17/037,120, filed on Sep. 29, 2020, now Pat. No. 11,387,341.

(51) Int. Cl.
*H01L 29/423* (2006.01)
*H01L 29/06* (2006.01)
(Continued)

(52) U.S. Cl.
CPC .... *H01L 29/42392* (2013.01); *H01L 29/0673* (2013.01); *H01L 29/66545* (2013.01);
(Continued)

(58) Field of Classification Search
CPC .......... H01L 29/42392; H01L 29/0673; H01L 29/66545; H01L 29/66553;
(Continued)

(56) References Cited

U.S. PATENT DOCUMENTS

| | | | |
|---|---|---|---|
| 11,387,341 B2 * | 7/2022 | Lin | H01L 29/66545 |
| 2019/0027570 A1 * | 1/2019 | Ching | H01L 29/6653 |

(Continued)

OTHER PUBLICATIONS

Notice of Allowance on U.S. Appl. No. 17/037,120, dated Mar. 14, 2022.
(Continued)

*Primary Examiner* — Tong-Ho Kim
(74) *Attorney, Agent, or Firm* — Foley & Lardner LLP

(57) ABSTRACT

A semiconductor device includes a plurality of semiconductor layers vertically separated from one another. Each of the plurality of semiconductor layers extends along a first lateral direction. The semiconductor device includes a gate structure that extends along a second lateral direction and comprises at least a lower portion that wraps around each of the plurality of semiconductor layers. The lower portion of the gate structure comprises a plurality of first gate sections that are laterally aligned with the plurality of semiconductor layers, respectively, and wherein each of the plurality of first gate sections has ends that each extend along the second lateral direction and present a first curvature-based profile.

20 Claims, 36 Drawing Sheets

(51) Int. Cl.
  *H01L 29/66* (2006.01)
  *H01L 29/78* (2006.01)
  *H01L 29/786* (2006.01)
  *H01L 21/3065* (2006.01)

(52) U.S. Cl.
  CPC .. *H01L 29/66553* (2013.01); *H01L 29/66742* (2013.01); *H01L 29/7831* (2013.01); *H01L 29/78696* (2013.01); *H01L 21/3065* (2013.01)

(58) Field of Classification Search
  CPC ........... H01L 29/66742; H01L 29/7831; H01L 29/78696; H01L 21/3065; H01L 29/0649; H01L 29/0692; H01L 29/401; H01L 29/4238; H01L 29/66439; H01L 29/775; H01L 29/785; H01L 29/0665; H01L 29/0669; H01L 29/42356; H01L 29/66795; B82Y 10/00
  USPC ........................................................ 257/288
  See application file for complete search history.

(56) References Cited

U.S. PATENT DOCUMENTS

2020/0381547 A1   12/2020  Song et al.
2021/0193654 A1*  6/2021  Park ...................... H01L 29/785

OTHER PUBLICATIONS

U.S. Office Action on U.S. Appl. No. 17/037,120, dated Dec. 2, 2021.

\* cited by examiner

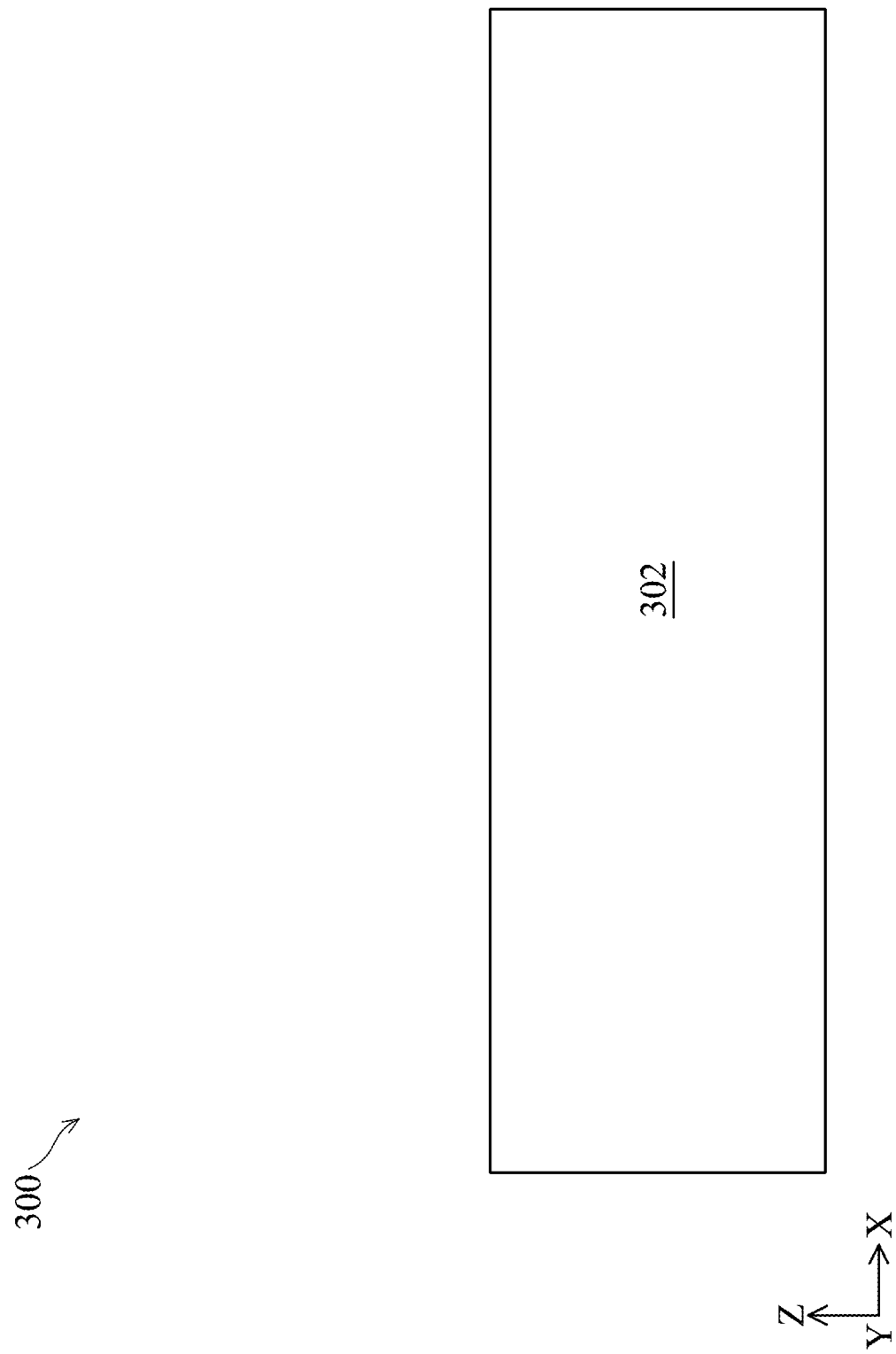

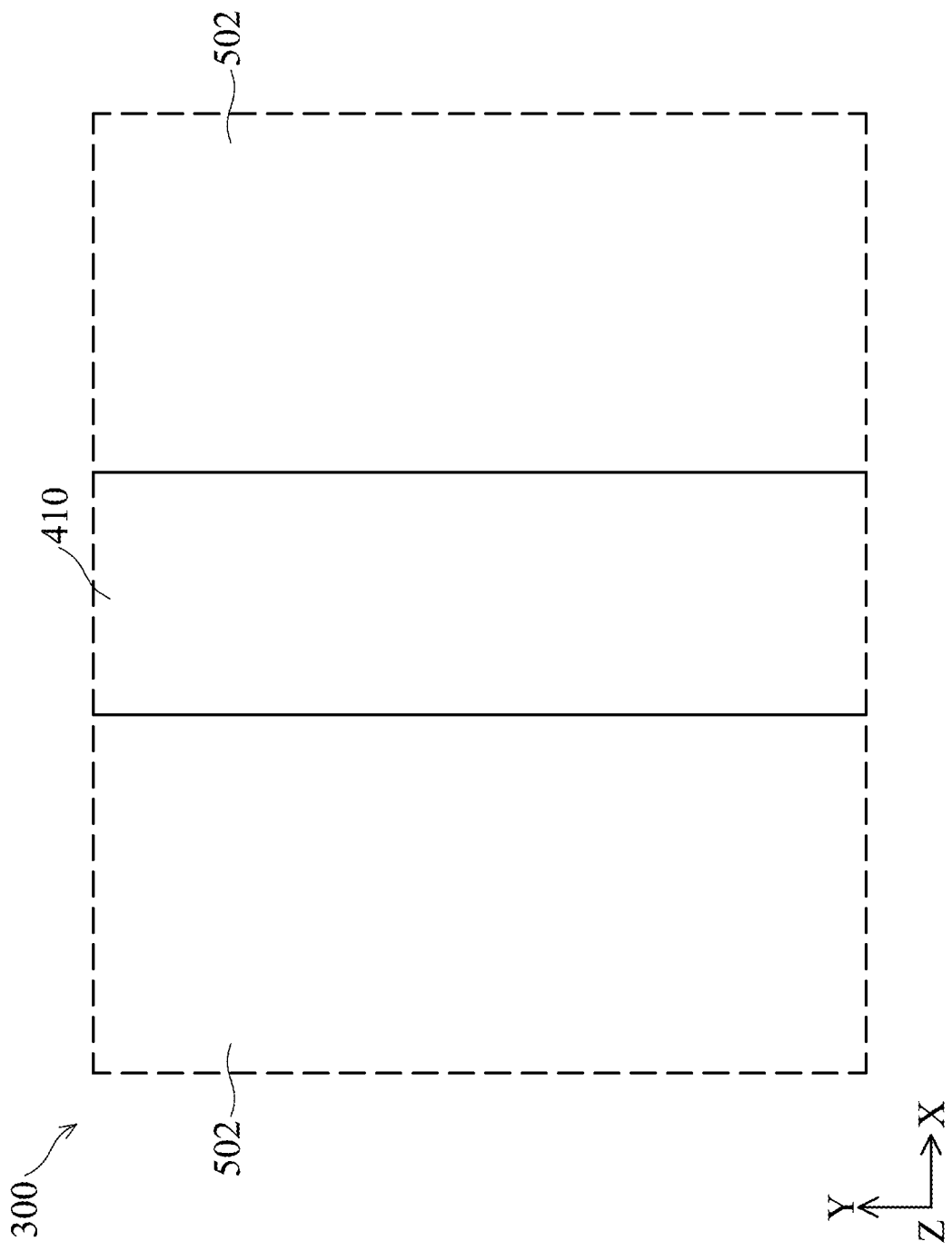

SEMICONDUCTOR DEVICES AND METHODS OF MANUFACTURING THEREOF

CROSS-REFERENCE TO RELATED APPLICATION

This application is a continuation of U.S. patent application Ser. No. 17/037,120, filed on Sep. 29, 2020, which is incorporated herein by reference in its entirety.

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4A, 4B, 5A, 5B, 5C, 6A, 6B, 6C, 7A, 7B, 7C, 8, 9A, 9B, 9C, 9D, 9E, 10A, 10B, 10C, 10D, 10E, 11A, 11B, 11C, 11D, 11E, 11F, 11G, 11H, 11I, 11J, and 11K illustrate cross-sectional views of an example GAA FET device (or a portion of the example GAA FET device) during various fabrication stages, made by the method of FIG. 2, in accordance with some embodiments.

DETAILED DESCRIPTION

Figure 1:
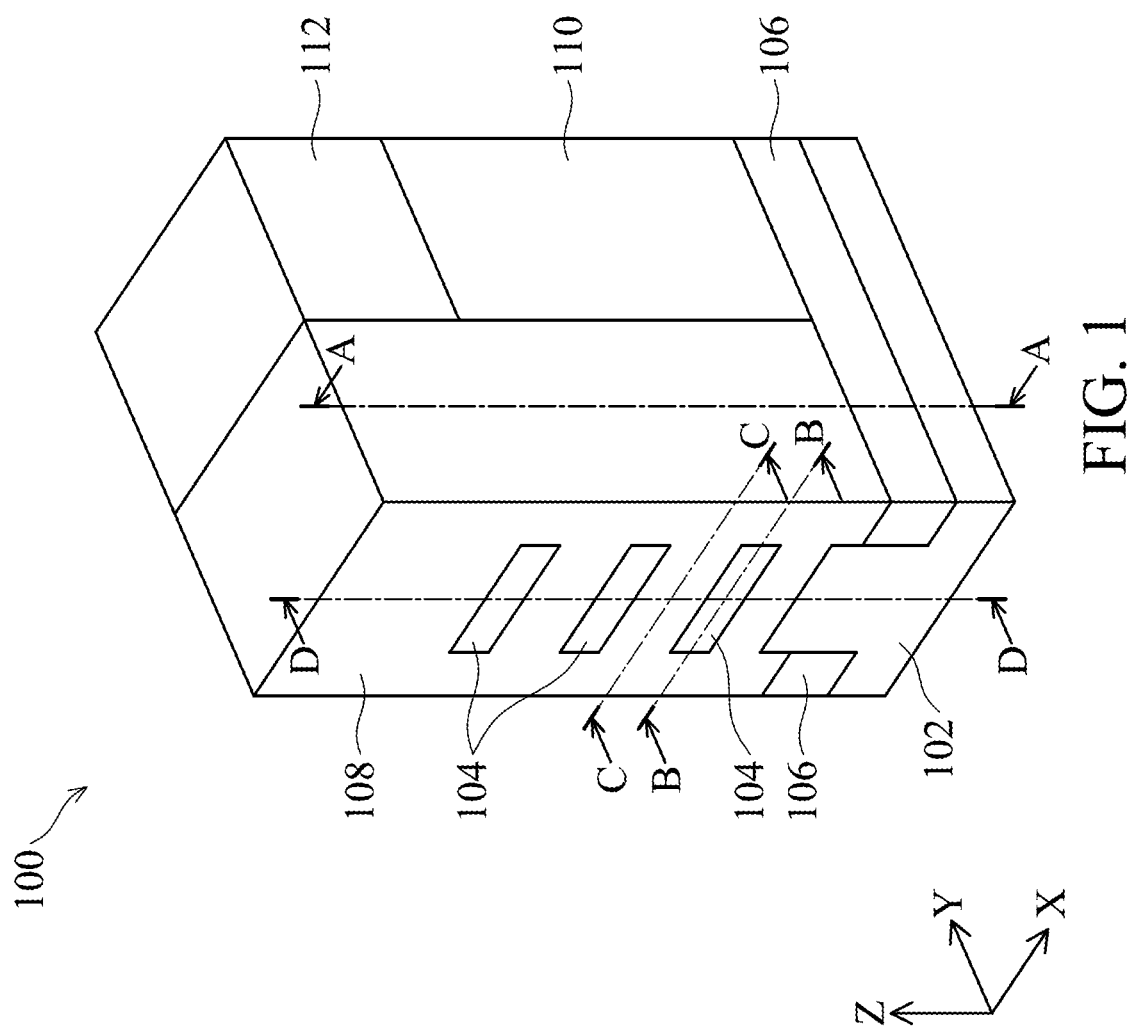
FIG. 1 illustrates a perspective view of a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a gate-all-around (GAA) field-effect-transistor (FET) device, and in particular, in the context of forming a replacement gate of a GAA FET device. In some embodiments, after forming a fin including a number of first semiconductor layers and a number of second semiconductor layers, which serve as sacrificial layers and channel layers, respectively, a connected (or interfacial) layer is formed over the fin. The connected layer may present a certain etching selectivity with respect to respective materials of the first and second semiconductor layers. Next, a dummy gate structure is formed over the fin, followed by a pull-back process that etches end portions of the sacrificial (first semiconductor) layers of the fin and end portions of the dummy gate structure more quickly than the connected layer (along a lengthwise direction of the fin). The respective etched portions (of the sacrificial layers and the dummy gate structure) are then filled with inner spacers. Next, source/drain structures are formed on opposite sides of the dummy gate structure, with an interlayer dielectric (ILD) overlaying them. Upon forming the ILD, the dummy gate structure is removed to form a gate trench. Next, the sacrificial layers are removed to extend the gate trench. An active gate structure is next formed in the gate trench to wrap around each of the channel layers.

An active gate structure formed by the above described method can provide various advantages in advanced technology nodes. In general, a dummy gate structure is replaced with an active gate structure, and thus, the active gate structure may inherit the dimensions and profiles of the dummy gate structure (as formed). The existing technologies, however, face various issues, when forming the dummy gate structure over a fin that have first and second semiconductor layers formed of different materials. For example, the interface between the dummy gate structure and the fin is relatively rough (which may in turn result in forming one or more voids after the dummy gate structure is replaced). This may be partially due to the different materials of the first and second semiconductor layers having respective interfacial reaction with the dummy gate structure. By overlaying the fin with the disclosed connected layer that may "integrate" such different materials of the first and second semiconductor layers, the above-identified issues may be avoided. Further, the dummy gate structure can have a relatively smooth interface contacting the fin (or the connected layer), which can enhance overall performance of the formed device (e.g., by increasing controllability of the active gate structure that replaces the dummy gate structure).

FIG. 1 illustrates a perspective view of an example GAA FET device 100, in accordance with various embodiments. The GAA FET device 100 includes a substrate 102 and a number of nanostructures (e.g., nanosheets, nanowires, etc.) 104 above the substrate 102. The semiconductor layers 104 are vertically separated from one another. Isolation regions 106 are formed on opposing sides of a protruded portion of the substrate 102, with the nanostructures 104 disposed above the protruded portion. A gate structure 108 wraps around each of the nanostructures 104 (e.g., a full perimeter of each of the nanostructures 104). Source/drain structures are disposed on opposing sides of the gate structure 108, e.g., source/drain structure 110 shown in FIG. 1. An interlayer dielectric (ILD) 112 is disposed over the source/drain structure 110.

FIG. 1 depicts a simplified GAA FET device, and thus, it should be understood that one or more features of a completed GAA FET device may not be shown in FIG. 1. For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A is cut along a longitudinal axis of the gate structure 108 (e.g., in the X direction); cross-section B-B is cut along a longitudinal axis of one of the semiconductor layers 104; cross-section C-C, which is parallel with cross-section B-B, is cut between two adjacent ones of the semiconductor layers 104; and cross-section D-D, which is perpendicular to the cross-section A-A, is cut along a longitudinal axis of the semiconductor layers 104 and in a direction of a current flow between the source/drain structures (e.g., in the Y direction). Subsequent figures refer to these reference cross-sections for clarity.

Figure 2:
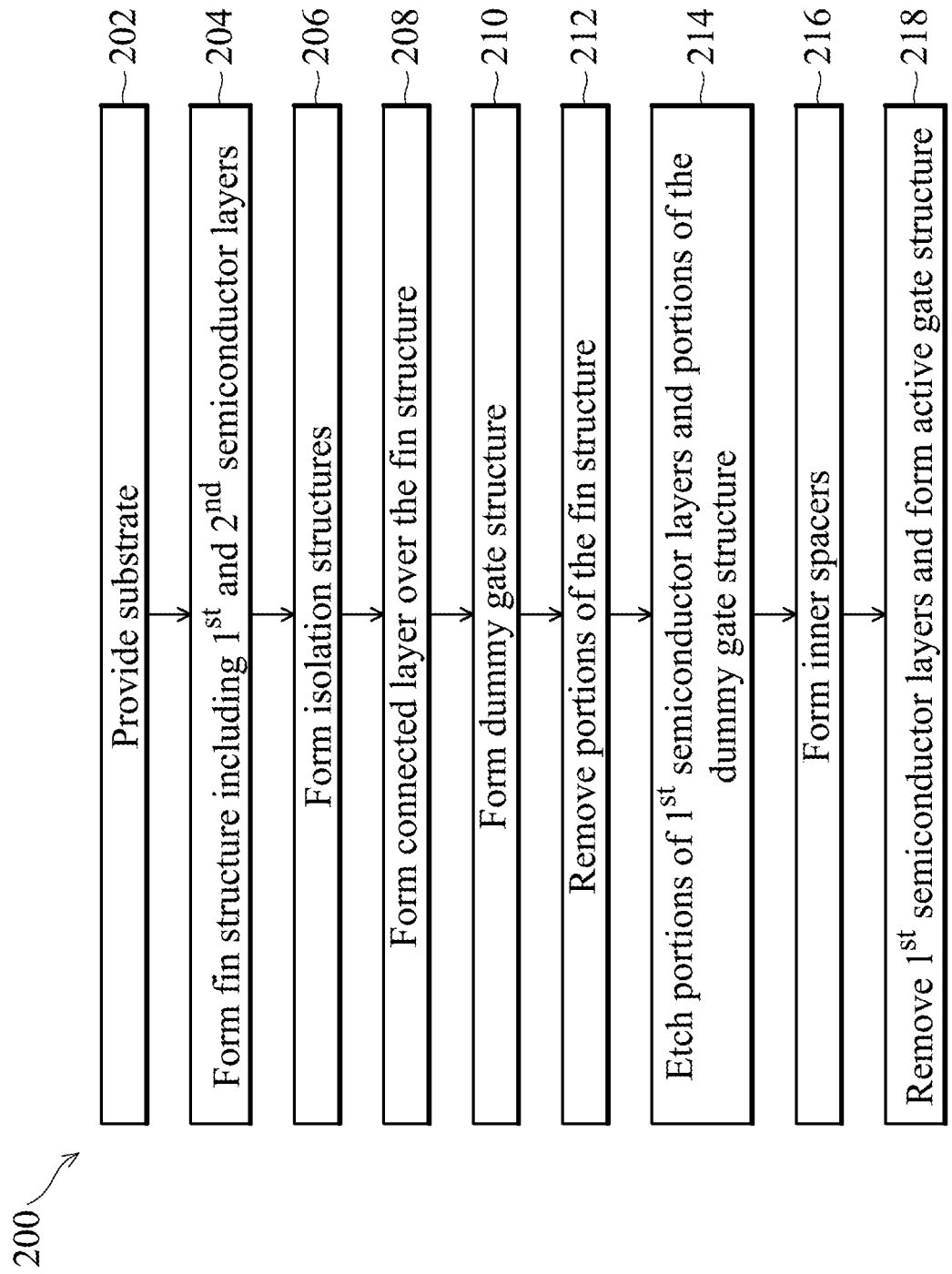
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device, a GAA FET device (e.g., GAA FET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example GAA FET device at various fabrication stages as shown in FIGS. 3, 4A, 4B, 5A, 5B, 5C, 6A, 6B, 6C, 7A, 7B, 7C, 8, 9A, 9B, 9C, 9D, 9E, 10A, 10B, 10C, 10D, 10E, 11A, 11B, 11C, 11D, 11E, 11F, 11G, 11H, 11I, 11J, and 11K, respectively, which will be discussed in further detail below.

In brief overview, the method 200 starts with operation 202 of providing a substrate. The method 200 continues to operation 204 of forming a fin structure including a number of first semiconductor layers and a number of second semiconductor layers. The method 200 continues to operation 206 of forming an isolation structure. The method 200 continues to operation 208 of forming a connected layer over the fin structure. The method 200 continues to operation 210 of forming a dummy gate structure. The method 200 continues to operation 212 of removing portions of the fin structure. The method 200 continues to operation 214 of etching portions of the first semiconductor layers and portions of the dummy gate structure. The method 200 continues to operation 216 of forming inner spacers. The method 200 continues to operation 218 of removing the first semiconductor layers and forming an active gate structure.

As mentioned above, FIGS. 3-11K each illustrate, in a cross-sectional view, a portion of a GAA FET device 300 at various fabrication stages of the method 200 of FIG. 2. The GAA FET device 300 is similar to the GAA FET device 100 shown in FIG. 1, but with certain features/structures/regions not shown, for the purposes of brevity. For example, the following figures of the GAA FET device 300 do not include source/drain structures (e.g., 110 of FIG. 1). It should be understood the GAA FET device 300 may further include a number of other devices (not shown in the following figures) such as inductors, fuses, capacitors, coils, etc., while remaining within the scope of the present disclosure.

Corresponding to operation 202 of FIG. 2, FIG. 3 is a cross-sectional view of the GAA FET device 300 including a semiconductor substrate 302 at one of the various stages of fabrication. The cross-sectional view of FIG. 3 is cut in a direction perpendicular to the lengthwise direction of an active/dummy gate structure of the GAA FET device 300 (e.g., cross-section A-A indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4A:
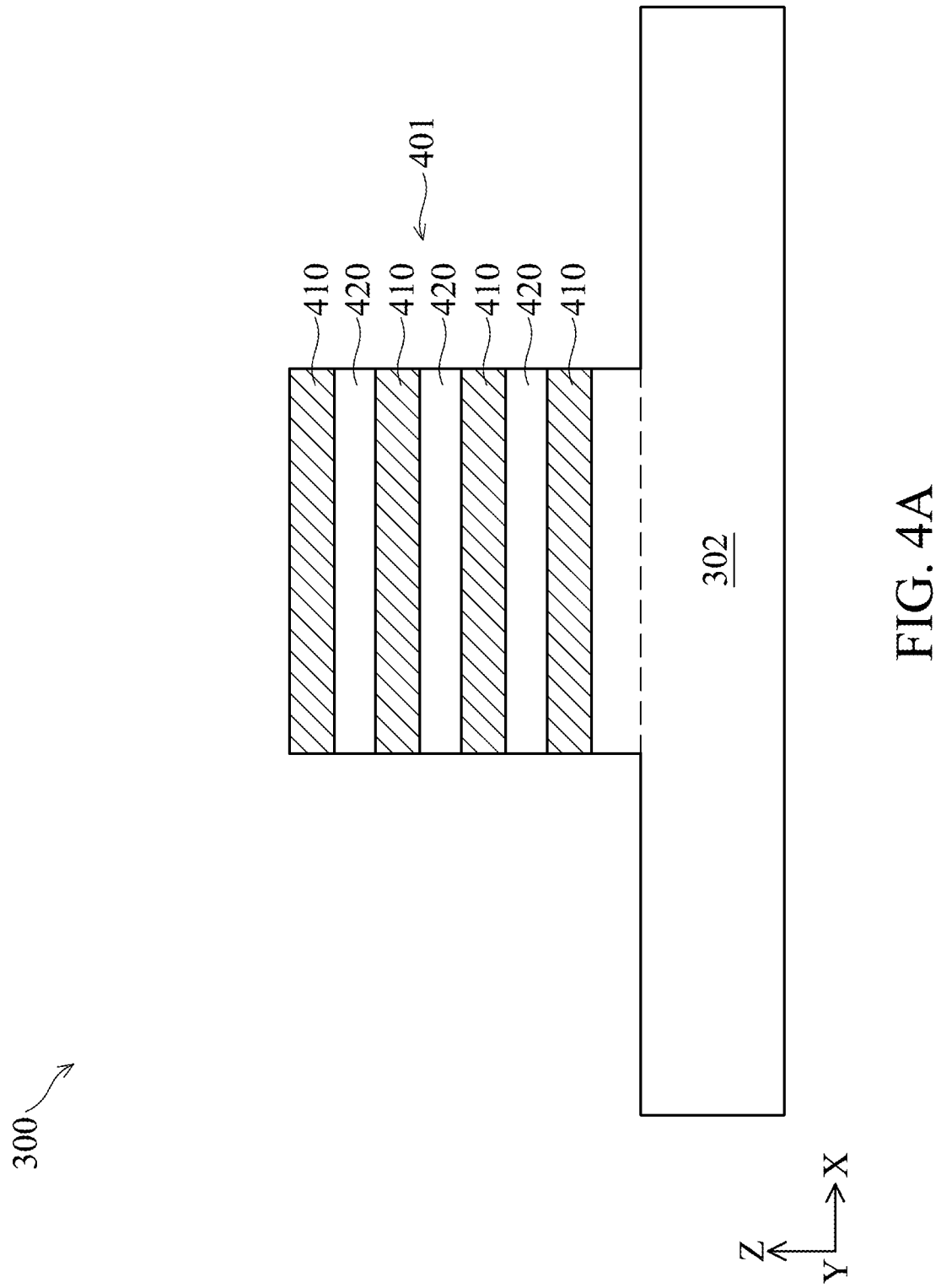
Figure 4B:
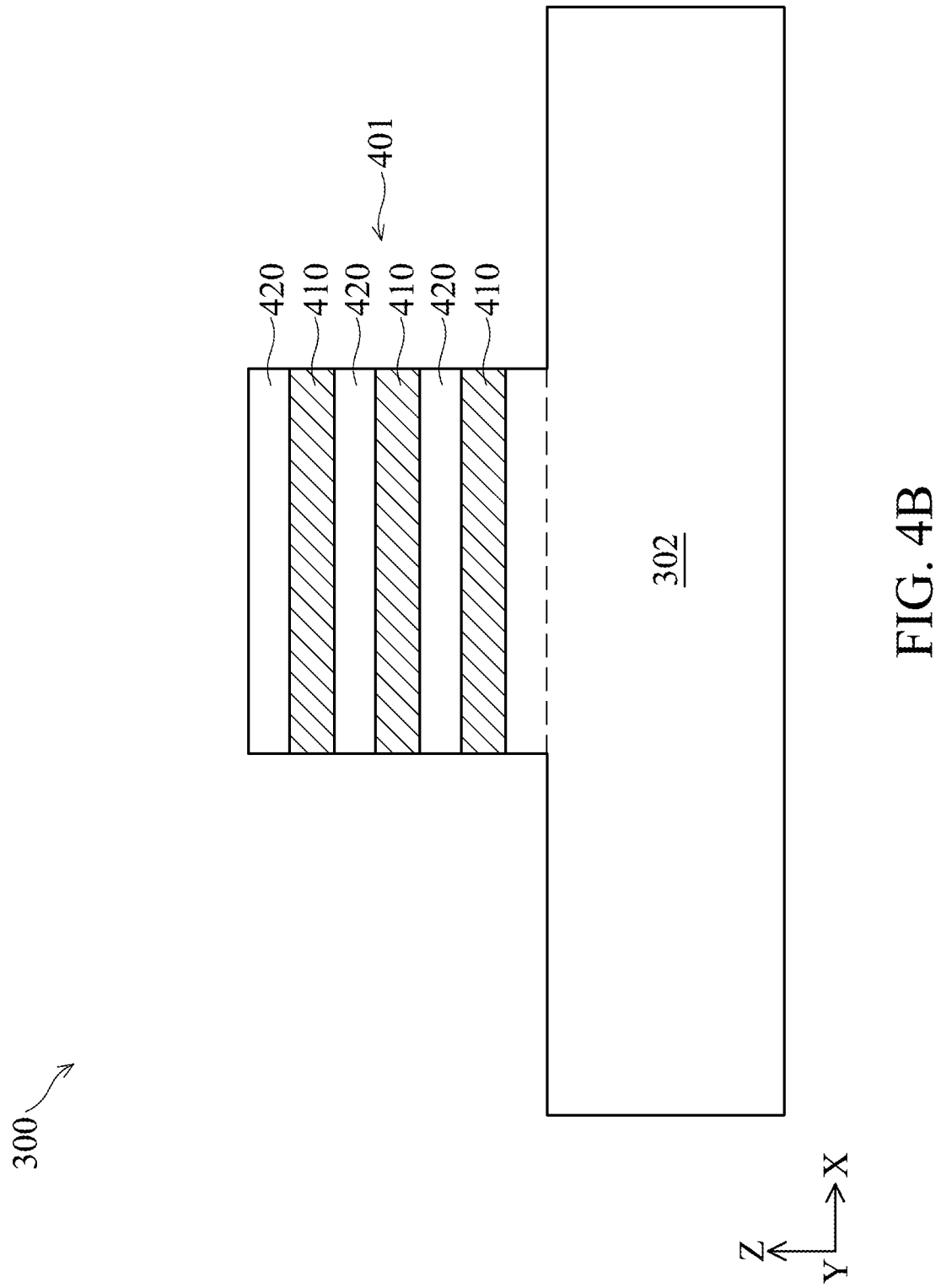

Corresponding to operation 204 of FIG. 2, FIG. 4A is a cross-sectional view of the GAA FET device 300 including a number of first semiconductor layers 410 and a number of second semiconductor layers 420 formed on the substrate 302 at one of the various stages of fabrication. Still corresponding to operation 204 of FIG. 2, FIG. 4B is a cross-sectional view of the GAA FET device 300 including a different number of the first semiconductor layers 410 and the same number of second semiconductor layers 420 formed on the substrate 302 at one of the various stages of fabrication. The cross-sectional views of FIGS. 4A-B are each cut in a direction perpendicular to the lengthwise direction of an active/dummy gate structure of the GAA FET device 300 (e.g., cross-section A-A indicated in FIG. 1).

Referring first to FIG. 4A, the first semiconductor layers 410 and the second semiconductor layers 420 are alternatingly disposed on top of one another (e.g., along the Z direction) to form a first stack. For example, one of the second semiconductor layers 420 is disposed over one of the first semiconductor layers 410 then another one of the first semiconductor layers 420 is disposed over the second semiconductor layer 410, so on and so forth. Similarly, in FIG. 4B, the first semiconductor layers 410 and the second semiconductor layers 420 are alternatingly disposed on top of one another (e.g., along a vertical direction) to form a second stack.

The first and second stacks may include any number of alternately disposed first and second semiconductor layers 410 and 420, respectively. For example in FIG. 4A, the first stack includes 4 first semiconductor layers 410, with 3 second semiconductor layers 420 alternatingly disposed therebetween and with one of the first semiconductor layers 410 being the topmost semiconductor layer. For example in FIG. 4B, the second stack includes 3 first semiconductor layers 410, with 2 second semiconductor layers 420 alternatingly disposed therebetween and with one of the second semiconductor layer 420 being the topmost semiconductor layer. It should be understood that the GAA FET device 300 can include any number of first semiconductor layers and any number of second semiconductor layers, with either one of the first or second semiconductor layers being the topmost semiconductor layer, while remaining within the scope of the present disclosure. Thus, in most of the following discussion, the stack shown in FIG. 4A will be used as a representative example.

The semiconductor layers 410 and 420 may have respective different thicknesses. Further, the first semiconductor layers 410 may have different thicknesses from one layer to another layer. The second semiconductor layers 420 may have different thicknesses from one layer to another layer. The thickness of each of the semiconductor layers 410 and 420 may range from few nanometers to few tens of nanometers. The first layer of the stack may be thicker than other semiconductor layers 410 and 420. In an embodiment, each of the first semiconductor layers 410 has a thickness ranging from about 5 nanometers (nm) to about 20 nm, and each of the second semiconductor layers 420 has a thickness ranging from about 5 nm to about 20 nm.

The two semiconductor layers 410 and 420 have different compositions. In various embodiments, the two semiconductor layers 410 and 420 have compositions that provide for different oxidation rates and/or different etch selectivity between the layers. In an embodiment, the first semiconductor layers 410 include silicon germanium ($Si_{1-x}Ge_x$), and the second semiconductor layers include silicon (Si). In an embodiment, each of the semiconductor layers 420 is silicon that may be undoped or substantially dopant-free (i.e., having an extrinsic dopant concentration from about $0 \text{ cm}^{-3}$ to about $1 \times 10^{17} \text{ cm}^{-3}$), where for example, no intentional doping is performed when forming the layers 420 (e.g., of silicon).

In various embodiments, the semiconductor layers 420 may be intentionally doped. For example, when the GAA FET device 300 is configured in n-type (and operates in an enhancement mode), each of the semiconductor layers 420 may be silicon that is doped with a p-type dopant such as boron (B), aluminum (Al), indium (In), and gallium (Ga); and when the GAA FET device 300 is configured in p-type (and operates in an enhancement mode), each of the semiconductor layers 420 may be silicon that is doped with an n-type dopant such as phosphorus (P), arsenic (As), antimony (Sb). In another example, when the GAA FET device 300 is configured in n-type (and operates in a depletion mode), each of the semiconductor layers 420 may be silicon that is doped with an n-type dopant instead; and when the GAA FET device 300 is configured in p-type (and operates in a depletion mode), each of the semiconductor layers 420 may be silicon that is doped with a p-type dopant instead. In some embodiments, each of the semiconductor layers 410 is $Si_{1-x}Ge_x$ that includes less than 50% (x<0.5) Ge in molar ratio. For example, Ge may comprise about 15% to 35% of the semiconductor layers 410 of $Si_{1-x}Ge_x$ in molar ratio. Furthermore, the first semiconductor layers 410 may include different compositions among them, and the second semiconductor layers 420 may include different compositions among them.

Either of the semiconductor layers 410 and 420 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 410 and 420 may be chosen based on providing differing oxidation rates and/or etch selectivity.

The semiconductor layers 410 and 420 can be epitaxially grown from the semiconductor substrate 302. For example, each of the semiconductor layers 410 and 420 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the semiconductor layers 410 and 420 having the same crystal orientation with the semiconductor substrate 302.

Upon growing the semiconductor layers 410 and 420 on the semiconductor substrate 302 (as a stack), the stack may be patterned to form one or more fin structures (e.g., 401). Each of the fin structures is elongated along a lateral direction (e.g., the Y direction), and includes a stack of patterned semiconductor layers 410-420 interleaved with each other. The fin structure 401 is formed by patterning the semiconductor layers 410-420 and the semiconductor substrate 302 using, for example, photolithography and etching techniques. For example, a mask layer (which can include multiple layers such as, for example, a pad oxide layer and an overlying pad nitride layer) is formed over the topmost semiconductor layer (e.g., 410 in FIG. 4A, or 420 in FIG. 4B). The pad oxide layer may be a thin film comprising silicon oxide formed, for example, using a thermal oxidation process. The pad oxide layer may act as an adhesion layer between the topmost semiconductor layer 410 (or the semiconductor layer 420 in some other embodiments) and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the semiconductor layers 410-420 and the substrate 302 to form trenches (or openings), thereby defining the fin structures 401 between adjacent trenches. When multiple fin structures are formed, such a trench may be disposed between any adjacent ones of the fin structures. In some embodiments, the fin structure 401 is formed by etching trenches in the semiconductor layers 410-420 and substrate 302 using, for example, reactive ion etch (ME), neutral beam etch (NBE), the like, or combinations thereof. The etch may be anisotropic. In some embodiments, the trenches may be strips (when viewed from the top) parallel to each other, and closely spaced with respect to each other. In some embodiments, the trenches may be continuous and surround the fin structure 401.

Figure 5A:
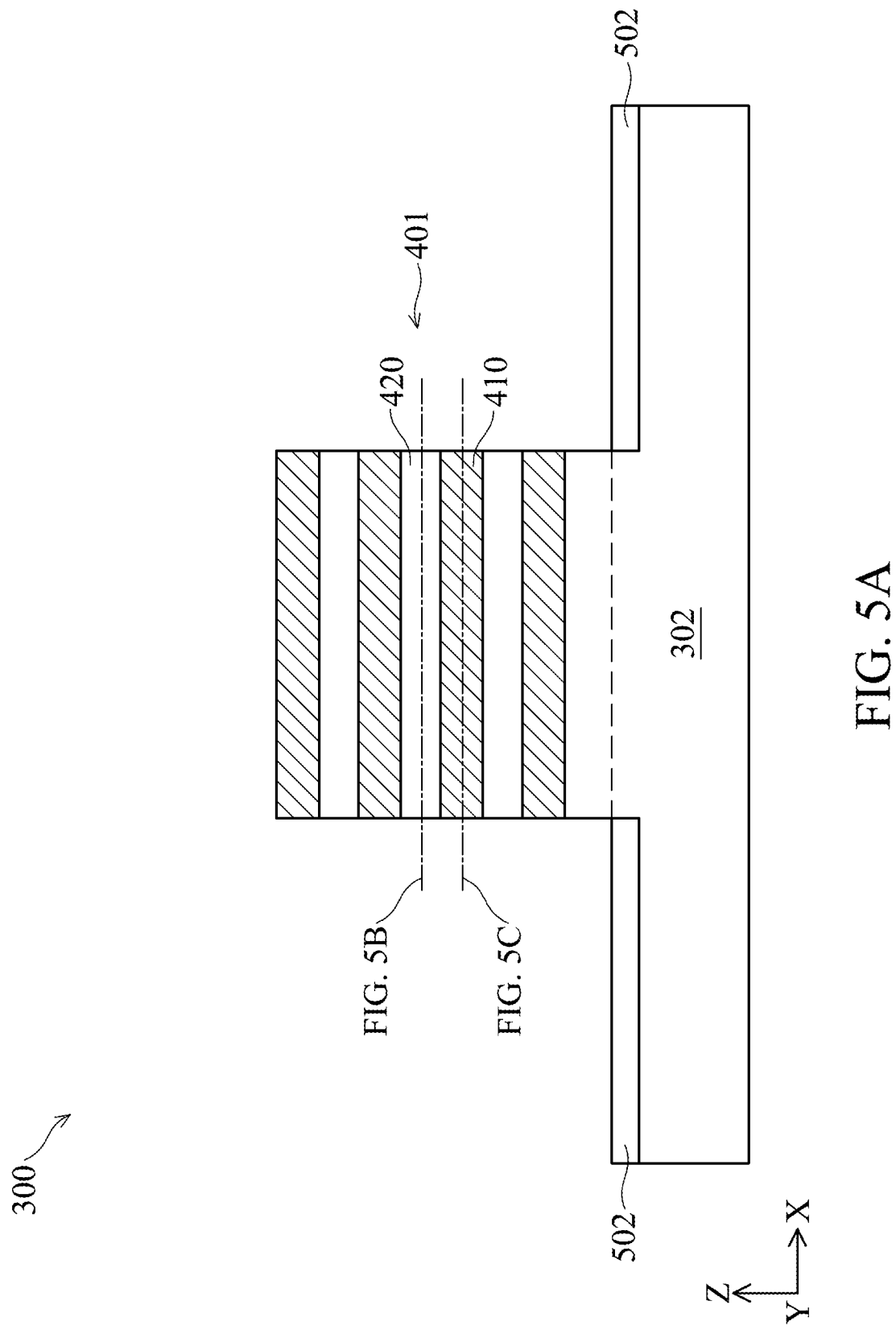
Figure 5B:
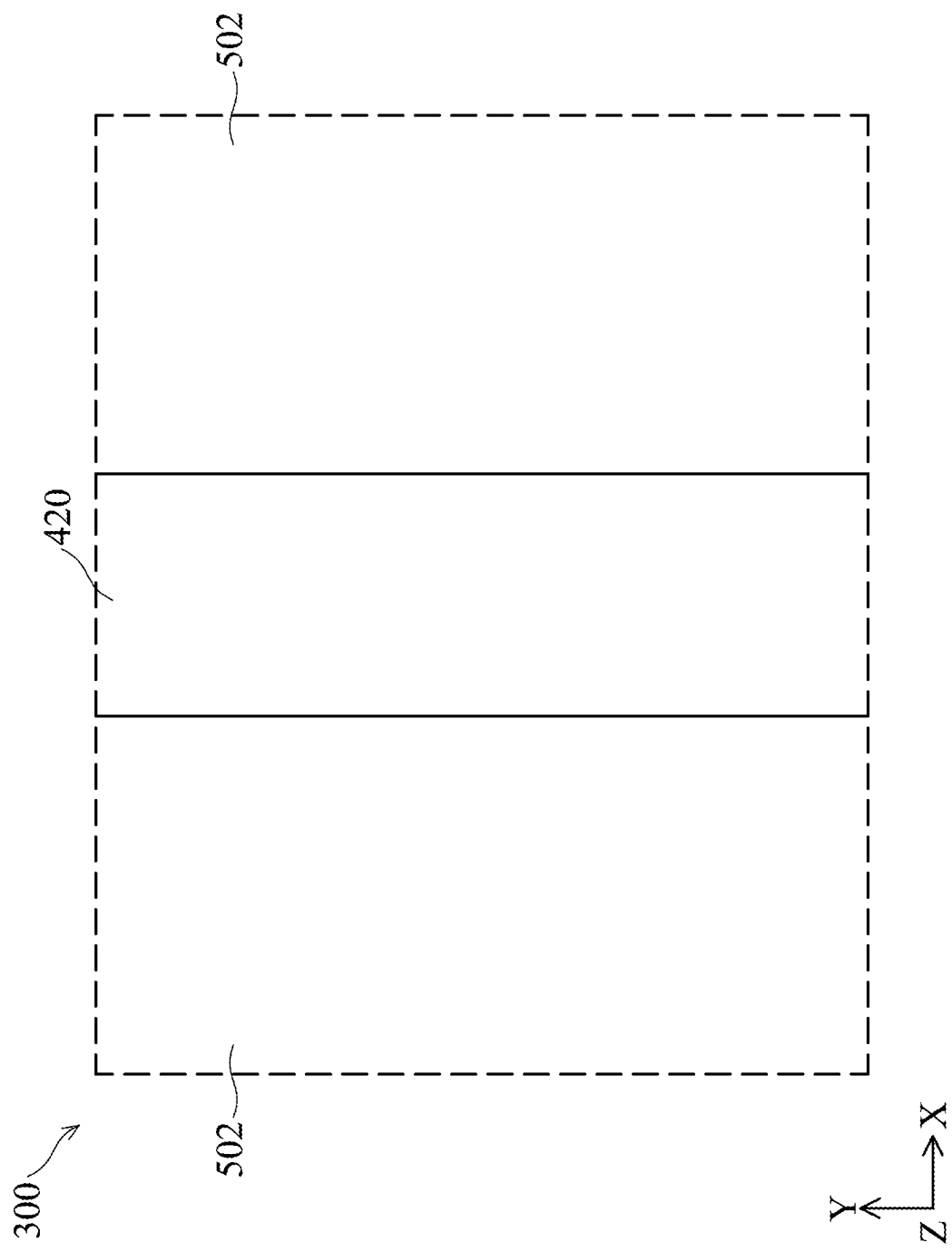

Corresponding to operation 206 of FIG. 2, FIG. 5A is a cross-sectional view of the GAA FET device 300 including one or more isolation structures 502, at one of the various stages of fabrication. The cross-sectional view of FIG. 5A is cut in a direction perpendicular to the lengthwise direction of an active/dummy gate structure of the GAA FET device 300 (e.g., cross-section A-A indicated in FIG. 1). Also corresponding to the same operation 206, FIGS. 5B and 5C depict cross-sectional views of the GAA FET device 300, which are cut along cross-section B-B and cross-section C-C (as indicated in FIG. 1), respectively.

The isolation structure 502, which can includes multiple portions, may be formed between adjacent fin structures, or next to a single fin structure. The isolation structure 502, which are formed of an insulation material, can electrically isolate neighboring fin structures from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CAR') process, may remove any excess insulation material and form a top surface of the insulation material and a top surface of a patterned mask (not shown) defining the fin structure 401. The patterned mask may also be removed by the planarization process, in various embodiments.

Next, the insulation material is recessed to form the isolation structure 502, as shown in FIG. 5A, which is sometimes referred to as a shallow trench isolation (STI). The isolation structure 502 is recessed such that the fin structure 401 protrudes from between neighboring portions of the isolation structure 502. The top surface of the isolation structures (STIs) 502 may have a flat surface (as illustrated), a convex surface, a concave surface (such as dishing), or combinations thereof. The top surface of the isolation structure 502 may be formed flat, convex, and/or concave by an appropriate etch. The isolation structure 502 may be recessed using an acceptable etching process, such as one that is selective to the material of the isolation structure 502. For example, a dry etch or a wet etch using dilute hydrofluoric (DHF) acid may be performed to recess the isolation structure 502.

As mentioned above, each of the first semiconductor layers 410 and second semiconductor layer 420 of the fin structure 401 is elongated along a lateral direction (e.g., the Y direction). For example in FIG. 5B, the second semiconductor layer 420 extends along the Y direction, with portions of the isolation structure 502 disposed next to the sides of the second semiconductor layer 420 along the X direction. For example in FIG. 5C, the first semiconductor layer 410 extends along the Y direction, with portions of the isolation structure 502 disposed next to the sides of the first semiconductor layer 410 along the X direction.

Figure 6A:
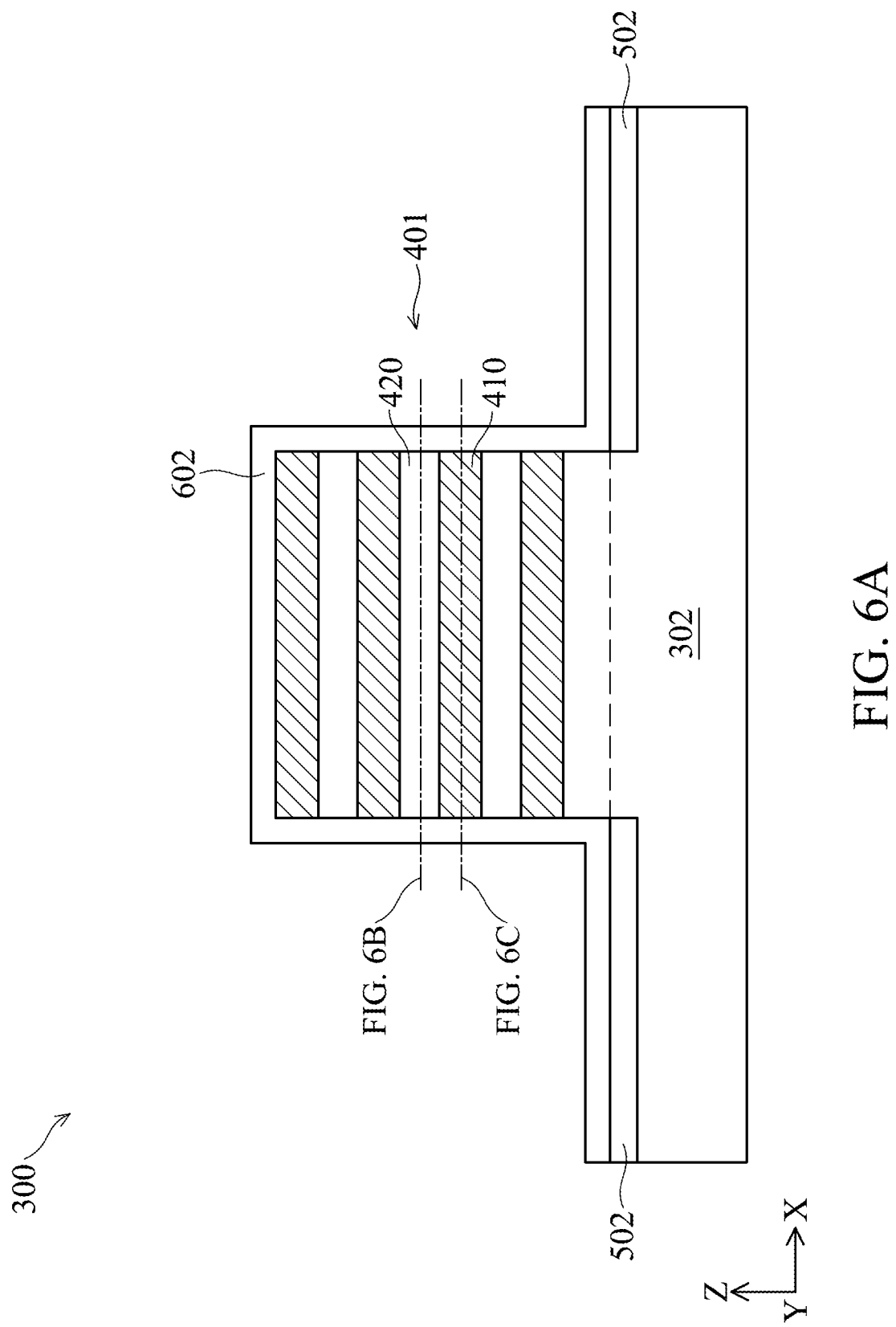
Figure 6B:
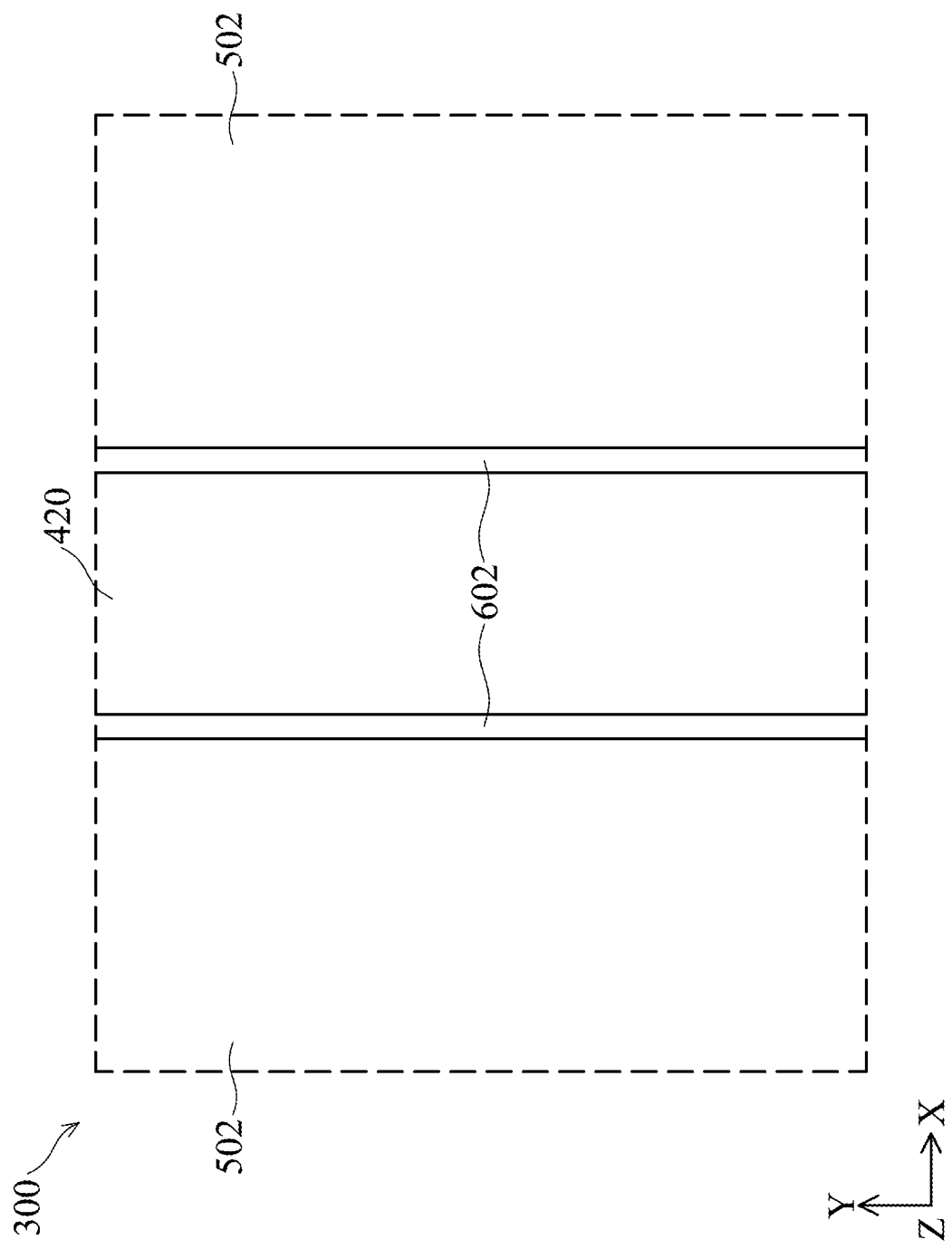
Figure 6C:
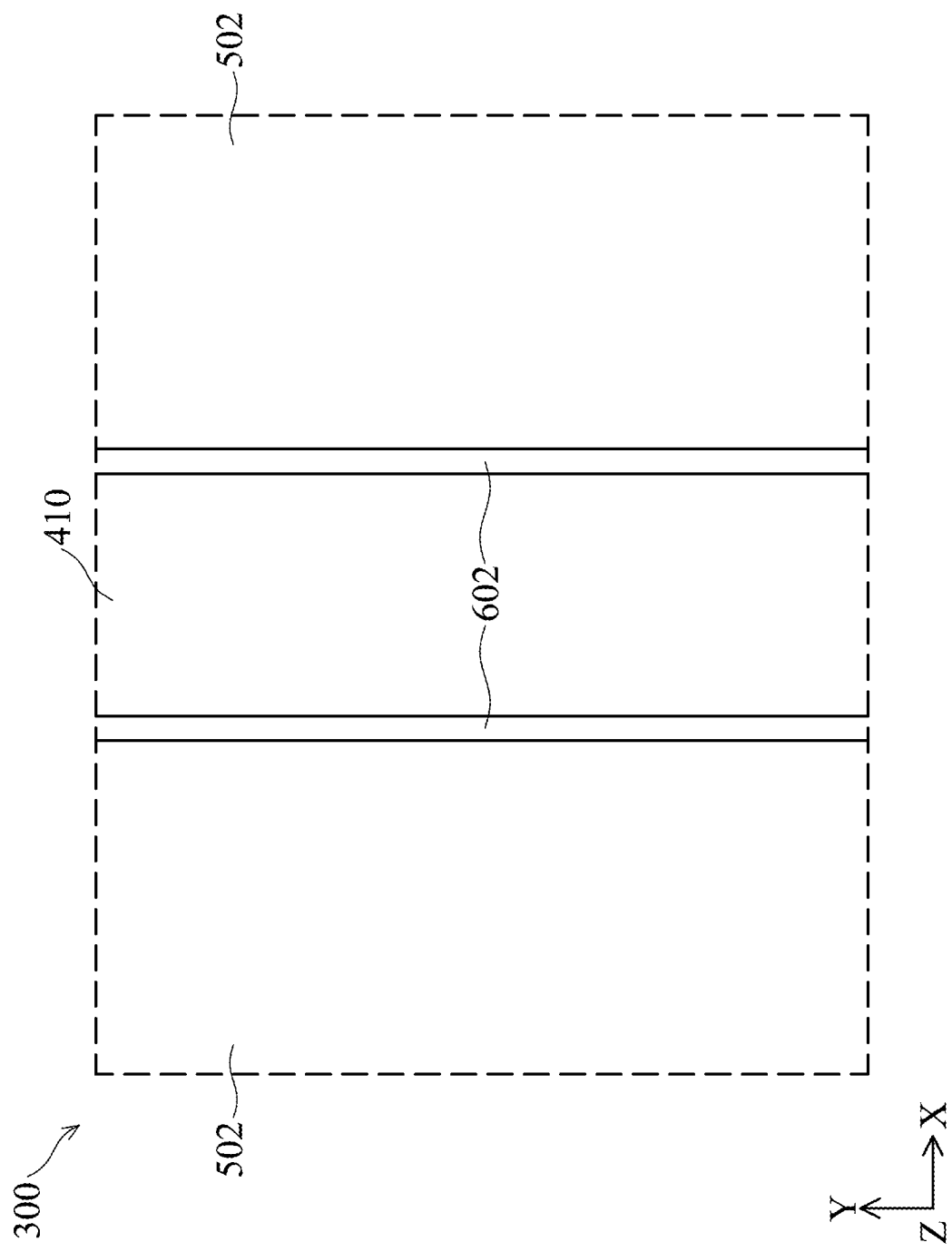

Corresponding to operation 208 of FIG. 2, FIG. 6A is a cross-sectional view of the GAA FET device 300 including a connected layer 602, at one of the various stages of fabrication. The cross-sectional view of FIG. 6A is cut in a direction perpendicular to the lengthwise direction of an active/dummy gate structure of the GAA FET device 300 (e.g., cross-section A-A indicated in FIG. 1). Also corresponding to the same operation 208, FIGS. 6B and 6C depict cross-sectional views of the GAA FET device 300, which are cut along cross-section B-B and cross-section C-C (as indicated in FIG. 1), respectively.

As shown in FIG. 6A, the connected layer 602 may be (e.g., conformally) formed to overlay the fin structure 401 and the isolation structure 502. For example, the connected layer 602 overlays a top surface of the fin structure 401 and extends along sidewalls of the fin structure 401, and further extends along the X direction, for example, to overlay the top surface of the isolation structure 502. As such, the connected layer 602 extends along sidewalls of each of the first semiconductor layers 410 and each of the second semiconductor layers 420 (that extend along the Y direction), as illustrated in FIGS. 6B and 6C.

In some embodiments, the connected layer 602 may be formed with a relatively thin thickness (e.g., from about 2 angstroms (Å) to about 50 (Å)) to smooth the surfaces of the fin structure 401, which may be constituted by multiple different materials. As such, a structure (e.g., a dummy gate structure, and a corresponding active gate structure) overlaying the fin structure 401 can be in better contact with the surfaces of the fin structure 401, which can significantly limit the odds of forming voids along the surfaces of the fin structure 401. Further, in some embodiments, the connected layer 602 may include one or more materials that have a certain etching selectivity with respect to the materials of the first and second semiconductor layers, 410 and 420, and the lower portion of a dummy gate structure. Accordingly, in one or more subsequent fabrication stages (e.g., etching portions of the first semiconductor layers and/or the dummy gate structure to form inner spacers), the first semiconductor layers and the dummy gate structure may each present a curvature-based profile, which will be discussed in further detail below.

In some embodiments, the connected layer 602 may be formed by treating the fin structure 401 having the first and second semiconductor layers 410 and 420. The treatment can include oxidizing, nitridizing, and/or sulfurizing the fin structure 401. As such, the connected layer 602 may include one or more treated materials of the first and second semiconductor layers 410 and 420. In an example where the first semiconductor layers 410 include SiGe and the second semiconductor layers 420 include Si, the connected layer 602 may include at least one of SiGeO or SiO (e.g., through an oxidizing treatment). In the same example, the connected layer 602 may include at least one of SiGeN or SiN (e.g., through a nitridizing treatment). Continuing with the same example, the connected layer 602 may include at least one of SiGeS or SiS (e.g., through a sulfurizing treatment).

For example, the connected layer 602 may be formed by performing an in-situ or ex-situ plasma process on the fin structure 401. In such a plasma process, passivation gases, such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof, can be used. Moreover, the passivation gases can be diluted with gases such as argon (Ar), helium (He), neon (Ne), and other suitable dilutive gases and combinations thereof to reach a certain condition. As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the plasma process. However, it is noted that source powers, bias powers, pressures, and flow rates outside of these ranges can also be contemplated.

In another example, the connected layer 602 may be formed by performing an ex-situ chemical/wet process on the fin structure 401. In such a chemical/wet process, passivation gases, such as ozone ($O_3$), carbon dioxide ($CO_2$), and other suitable passivation gases and combinations thereof, can be used, with assistive etch chemicals, such as sulfuric acid ($H_2SO_4$), ammonia ($NH_3$), and other suitable assistive etch chemicals and combinations thereof as well as solvents such as deionized water, alcohol, acetone, and other suitable solvents and combinations thereof.

In some other embodiments, the connected layer 602 may be formed by depositing a material over the fin structure 401. In such a case, the connected layer 602 may include, for example, silicon oxide ($SiO_2$), silicon nitride (SiN), silicon oxynitride (SiON), silicon carbide (SiC), silicon carbonitride (SiCN), silicon oxycarbonitride (SiOCN), silicon oxycarbide (SiOC), or combinations thereof. The deposition can include CVD, PECVD, ALD, FCVD, or combinations thereof.

Figure 7A:
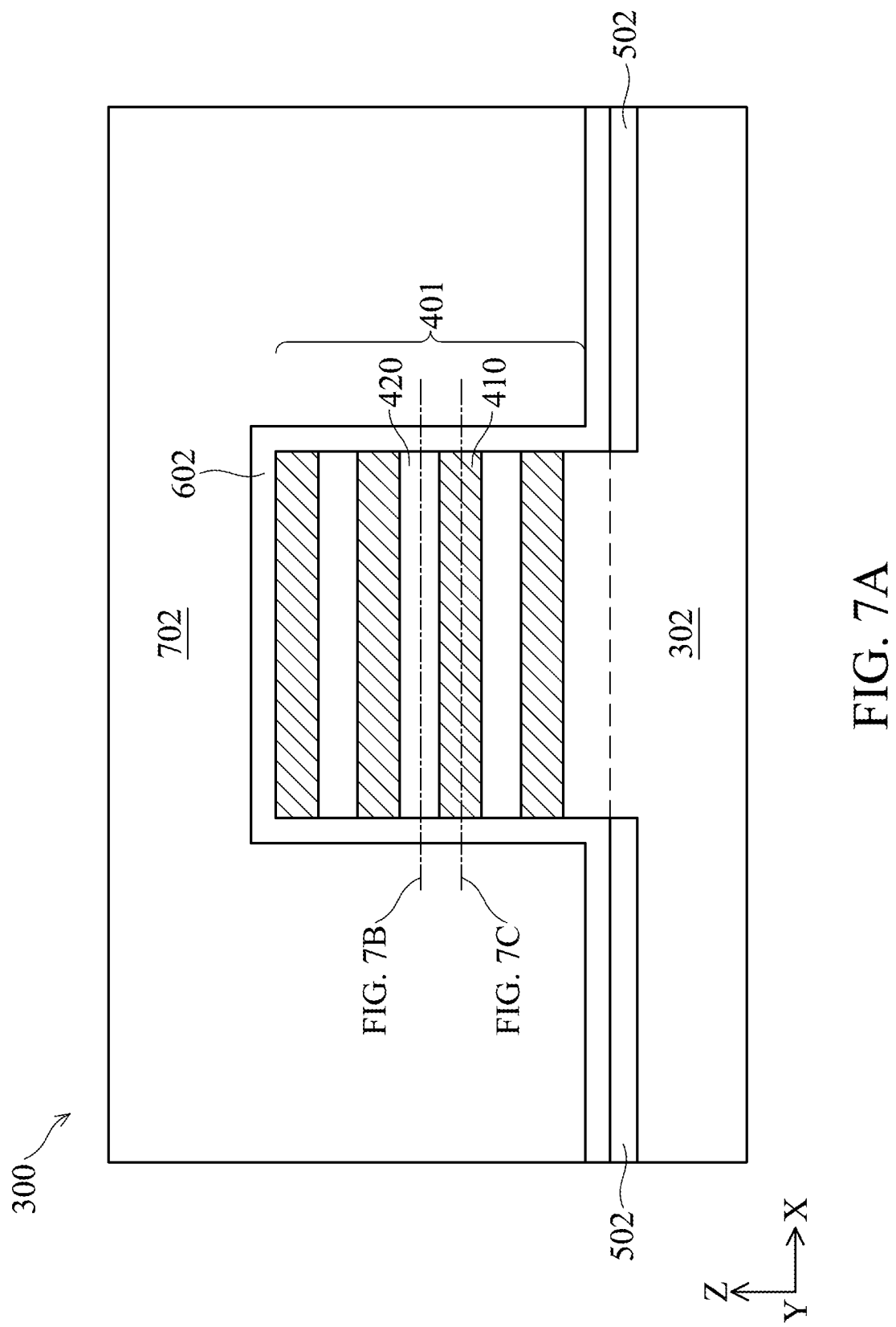
Figure 7B:
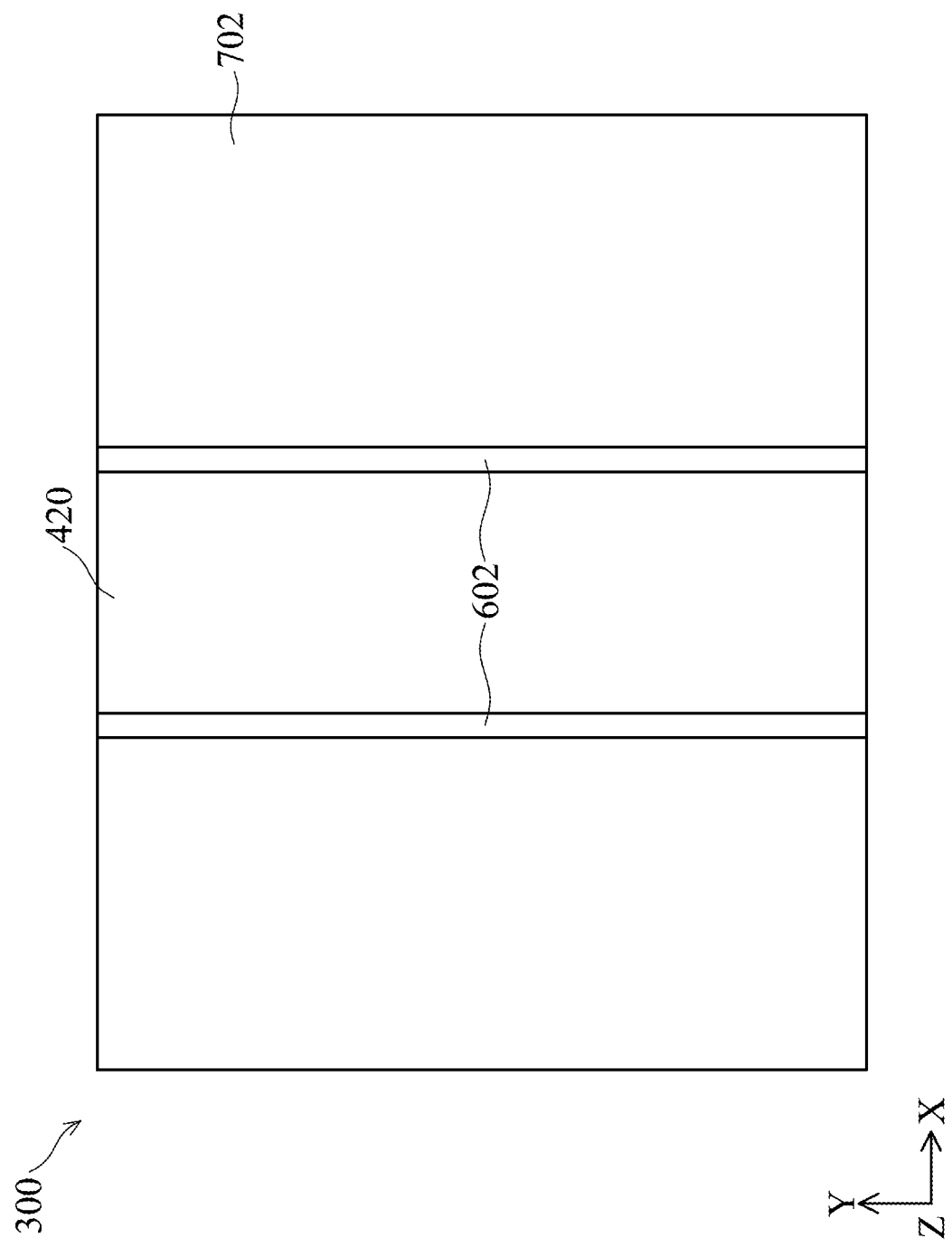
Figure 7C:
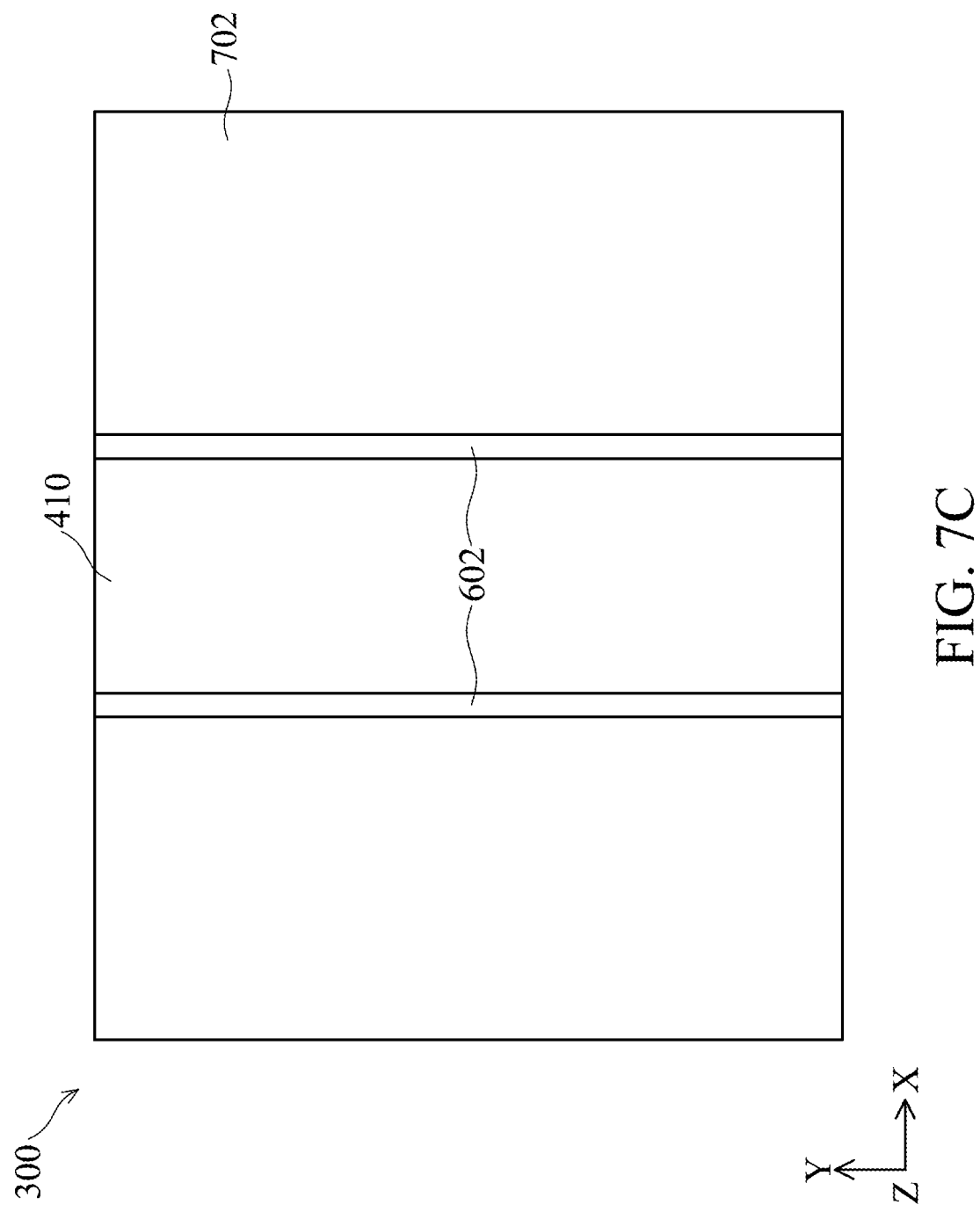

Corresponding to operation 210 of FIG. 2, FIG. 7A is a cross-sectional view of the GAA FET device 300 including a dummy gate structure 702, at one of the various stages of fabrication. The cross-sectional view of FIG. 7A is cut in a direction perpendicular to the lengthwise direction of an active/dummy gate structure of the GAA FET device 300 (e.g., cross-section A-A indicated in FIG. 1). Also corresponding to the same operation 210, FIGS. 7B and 7C depict cross-sectional views of the GAA FET device 300, which are cut along cross-section B-B and cross-section C-C (as indicated in FIG. 1), respectively.

Next, the dummy gate structure 702 is formed over the fin structure 401 and the isolation structure 502, with the connected layer 602 disposed therebetween. The dummy gate structure 702 can extend along a lateral direction (e.g., the X direction) perpendicular to the lateral direction along which the fin structure 401 extends. The dummy gate structure 702 may be placed where an active (e.g., metal) gate structure is later formed, in various embodiments. In some embodiments, the dummy gate structure 702 is placed over a portion of fin structure 401, with the connected layer 602 sandwiched therebetween. Such an overlaid portion of the fin structure 401 is later formed as a conduction channel, which includes portions of the second semiconductor layers 420 and portions of the first semiconductor layers 410 that are each replaced with an active gate structure. As such, the active gate structure can wrap around each of the portions of the second semiconductor layers 420, which will be discussed in further detail below.

In some embodiments, the dummy gate structure 702 can include one or more Si-based or SiGe-based materials that are similar (or having similar etching rates) as the first semiconductor layers 410 such as, for example, SiGe. The dummy gate structure 702 may be deposited by CVD, PECVD, ALD, FCVD, or combinations thereof. Although the dummy gate structure 702 is shown as being formed as a single-piece in the illustrated embodiment of FIG. 7A, it should be understood that the dummy gate structure 702 can be formed to have multiple portions, each of which may include respective different materials. For example, the dummy gate structure 702 may include a lower portion that extends from the isolation structure 502 to around a top surface of the connected layer 602, and an upper portion that further extends from the lower portion. In such embodiments, the lower portion of the dummy gate structure 702 can include the above-mentioned material that has a similar etching rate as the first semiconductor layers 410 (e.g., SiGe), and the upper portion of the dummy gate structure 702 can include a material that has a certain etching selectivity with respect to the fin structure 401 or is unfavorable to epitaxially grow source/drain structures.

Figure 8:
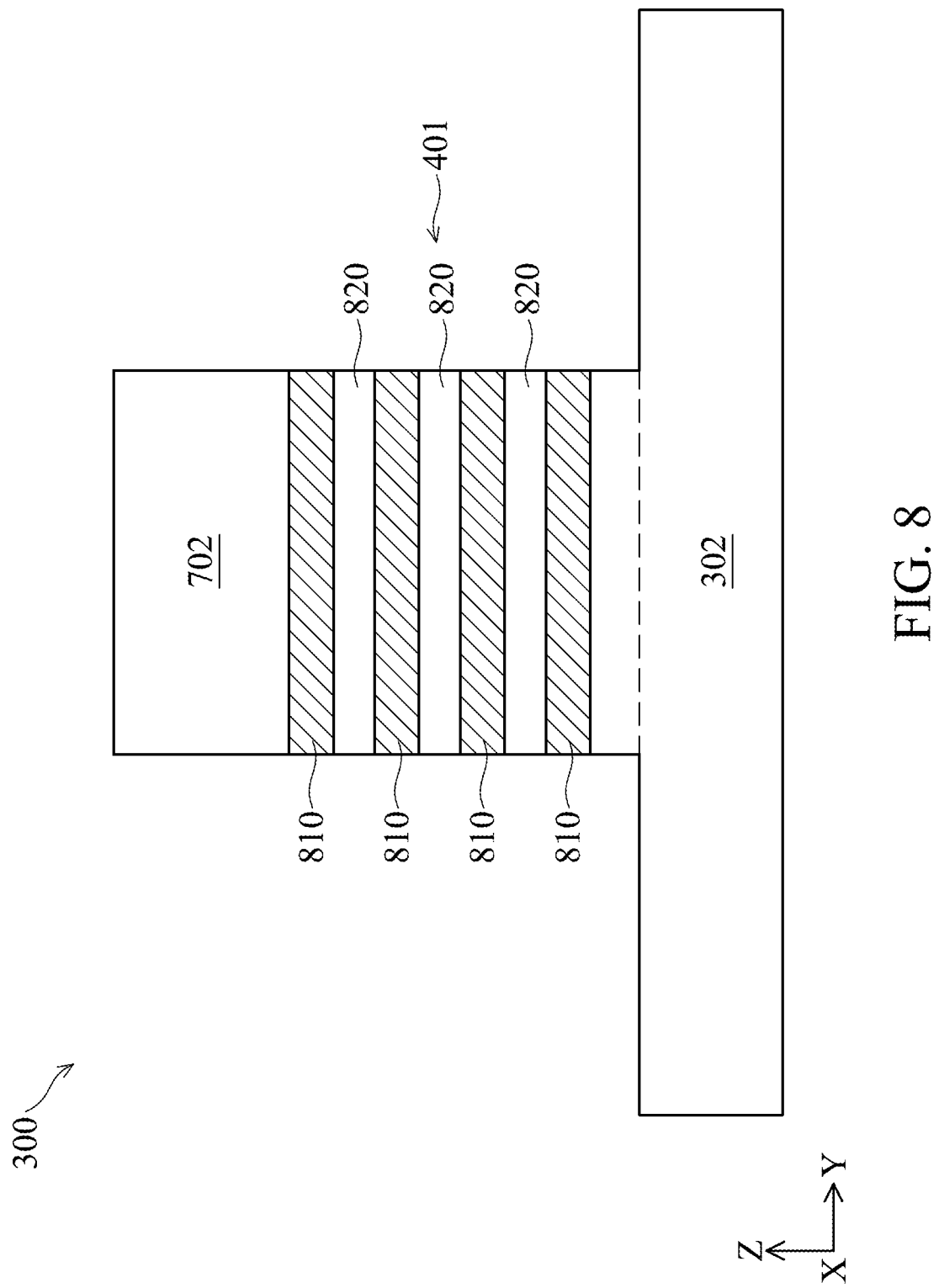

Corresponding to operation 212 of FIG. 2, FIG. 8 is a cross-sectional view of the GAA FET device 300 in which portions of the fin structure 401 that are not overlaid by the dummy gate structure 702 are removed, at one of the various stages of fabrication. The cross-sectional view of FIG. 8 is cut in the lengthwise direction of a fin structure of the GAA FET device 300 (e.g., cross-section D-D indicated in FIG. 1).

The dummy gate structure 702 can serve as a mask to etch the non-overlaid portions of the fin structure 401, which results in the fin structure 401 having one or more alternatingly stacks including remaining portions of the semiconductor layers 410 and 420. As a result, along the Z direction, newly formed sidewalls of each of the fin structures 401 are aligned with sidewalls of the dummy gate structure 702. For example in FIG. 8, semiconductor layers 810 and 820 are the remaining portions of the semiconductor layers 410 and 420 overlaid by the dummy gate structure 702, respectively. In some embodiments, the semiconductor layers 810 and 820 may sometimes be referred to as nanostructures (e.g., nanosheets) 810 and 820, respectively.

Figure 9A:
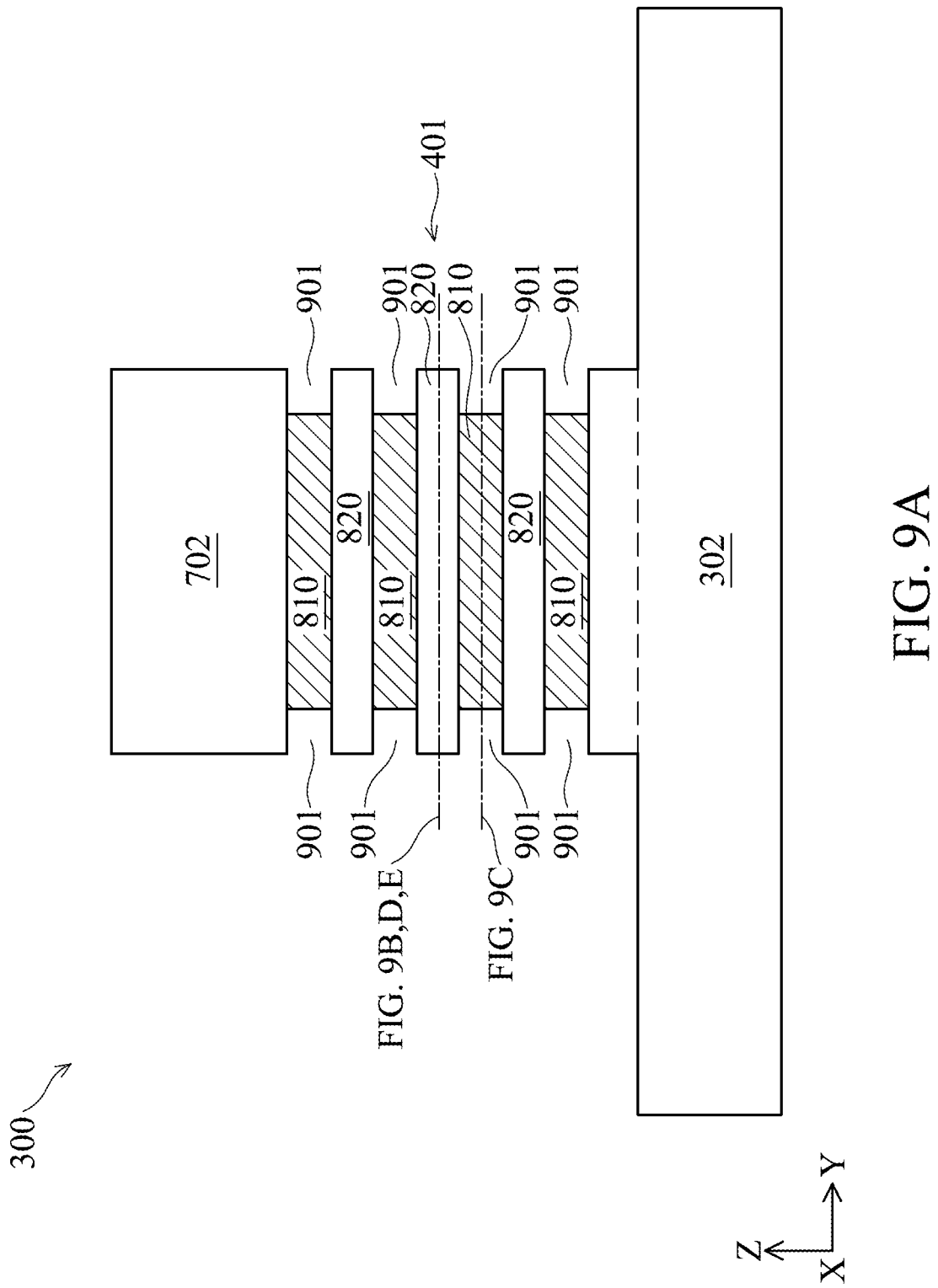

Corresponding to operation 214 of FIG. 2, FIG. 9A is a cross-sectional view of the GAA FET device 300 in which end portions of the nanostructures 810 (along the Y direction) are etched, at one of the various stages of fabrication. The cross-sectional view of FIG. 9A is cut in the lengthwise direction of a fin structure of the GAA FET device 300 (e.g., cross-section D-D indicated in FIG. 1). Also corresponding to the same operation 214, FIGS. 9B and 9C depict cross-sectional views of the GAA FET device 300, which are cut along cross-section B-B and cross-section C-C (as indicated in FIG. 1), respectively.

As shown in FIG. 9A, respective end portions of each of the nanostructures 810 are removed. The end portions of the nanostructures 810 can be removed (e.g., etched) using a "pull-back" process to pull the nanostructures 810 back by a pull-back distance. In an example where the semiconductor layers 820 include Si, and the semiconductor layers 810 include SiGe, the pull-back process may include a hydrogen chloride (HCl) gas isotropic etch process, which etches SiGe without attacking Si. As such, the Si layers (nanostructures) 820 may remain intact during this process. Consequently, recess 901 can be formed. Further, in various embodiments, the material of the nanostructures 810 (and the material of at least the lower portion of the dummy gate structure 702) have a certain etching selectivity with respect to the connected layer 602. For example, the pull-back process may etch the nanostructures 810 (and at least the lower portion of the dummy gate structure 702) more quickly than the connected layer 602, which can cause the recess 901 to present one or more curvature-based profiles at its ends. In various embodiments, the difference of etching rates between the nanostructures 810 (and the dummy gate structure 702) and the connected layer 602 may be adjusted by varying the molar ratio of Ge in the nanostructures 810, when first growing the semiconductor layers 410.

Figure 9B:
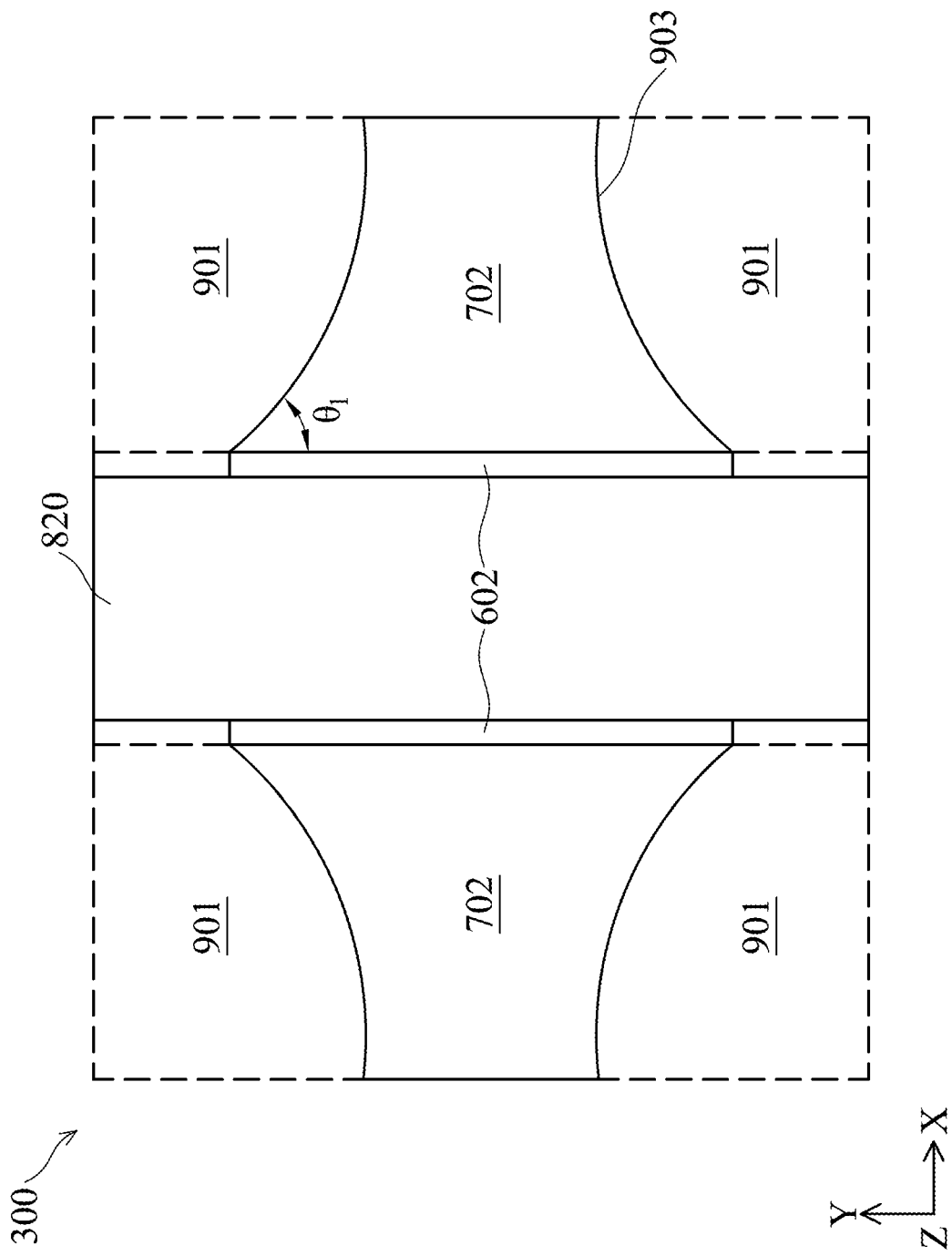

For example in FIG. 9B, the nanostructure 820 may remain intact, while end portions of the dummy gate structure 702 (along the Y direction) and end portions of the connected layer 602 (along the Y direction) are etched. Further, as the dummy gate structure 702 is etched faster than the connected layer 602, the recess 901 can present a first curvature-based profile 903 (e.g., at each end of a remaining portion of the dummy gate structure 702 that is about coplanar with one of the nanostructures 820). The first curvature-based profile 903 may include a single arc that inwardly curves toward the remaining dummy gate structure 702. As such, the profile 903 and the sidewall of the nanostructure 820 (or the connected layer 602) extending along the Y direction may form an angle, $\theta_1$. In some embodiments, the angle $\theta_1$ is less than 90 degrees.

Figure 9C:
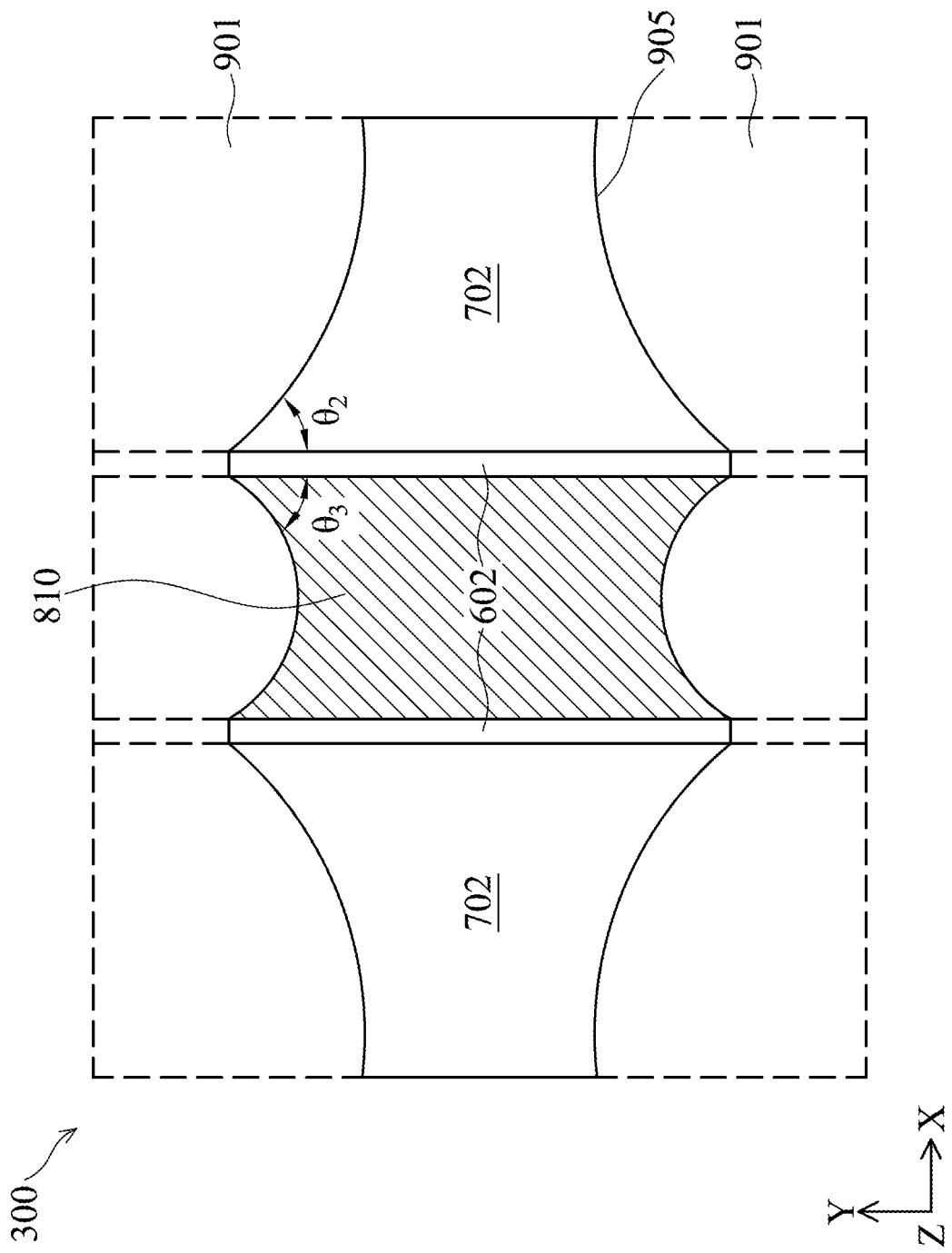

For example in FIG. 9C, different from the nanostructure 820, the nanostructures 810 may be concurrently etched, while etching the end portions of the dummy gate structure 702 (along the Y direction) and the end portions of the connected layer 602 (along the Y direction). Further, as the dummy gate structure 702 and nanostructure 820 are etched faster than the connected layer 602, the recess 901 can present a second curvature-based profile 905 (e.g., at each end of respective remaining portions of the dummy gate structure 702 and one of the nanostructures 810 that are about coplanar with such nanostructure 810). The second curvature-based profile 905 may include multiple arcs that each inwardly curve toward either the remaining dummy gate structure 702 or the remaining nanostructure 810. As such, each arc of the profile 905 and the sidewall of the nanostructure 810 (or the connected layer 602) extending along the Y direction may form two angles, $\theta_2$ and $\theta_3$. In some embodiments, the angles $\theta_2$ and $\theta_3$ are each less than 90 degrees.

Figure 9D:
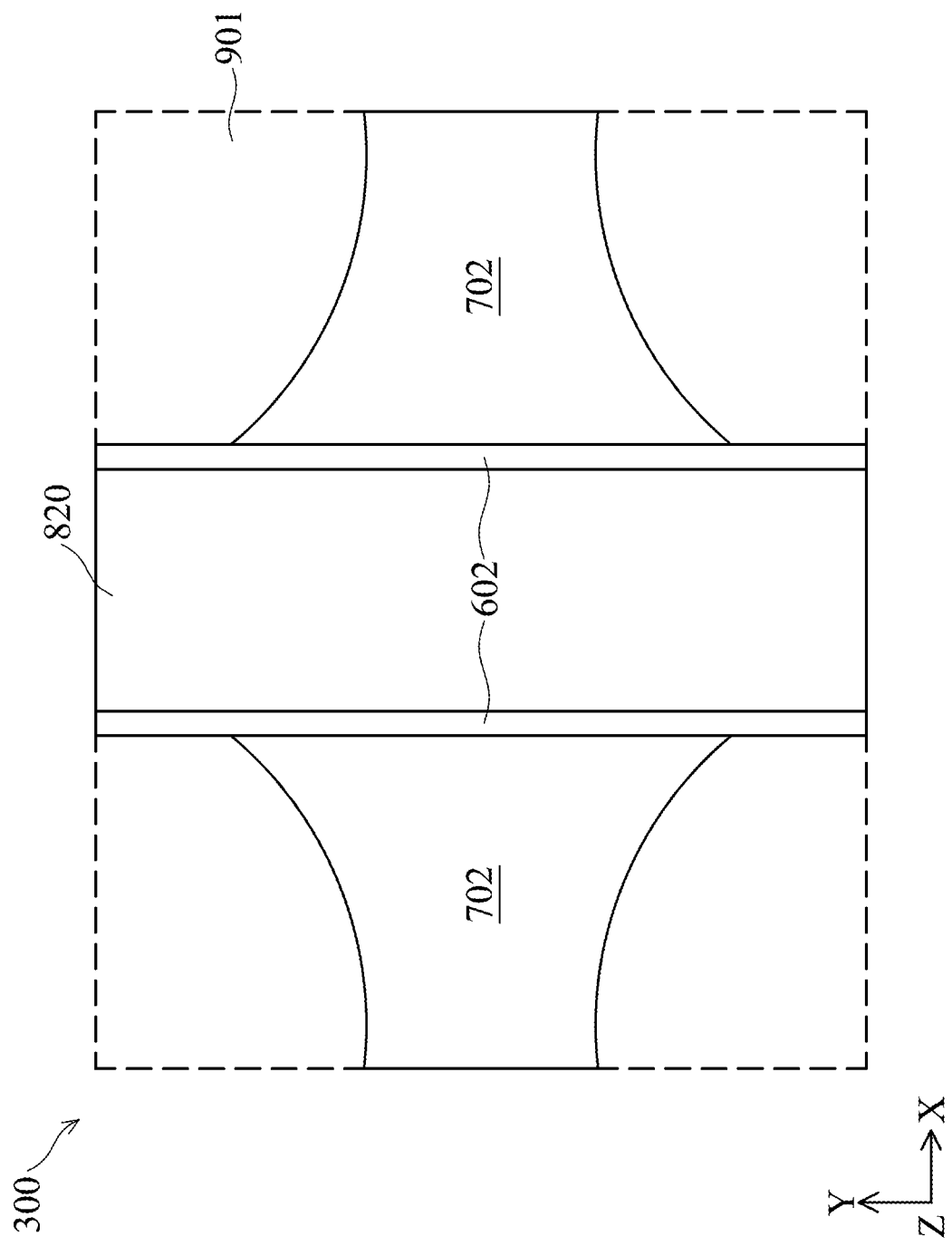
Figure 9E:
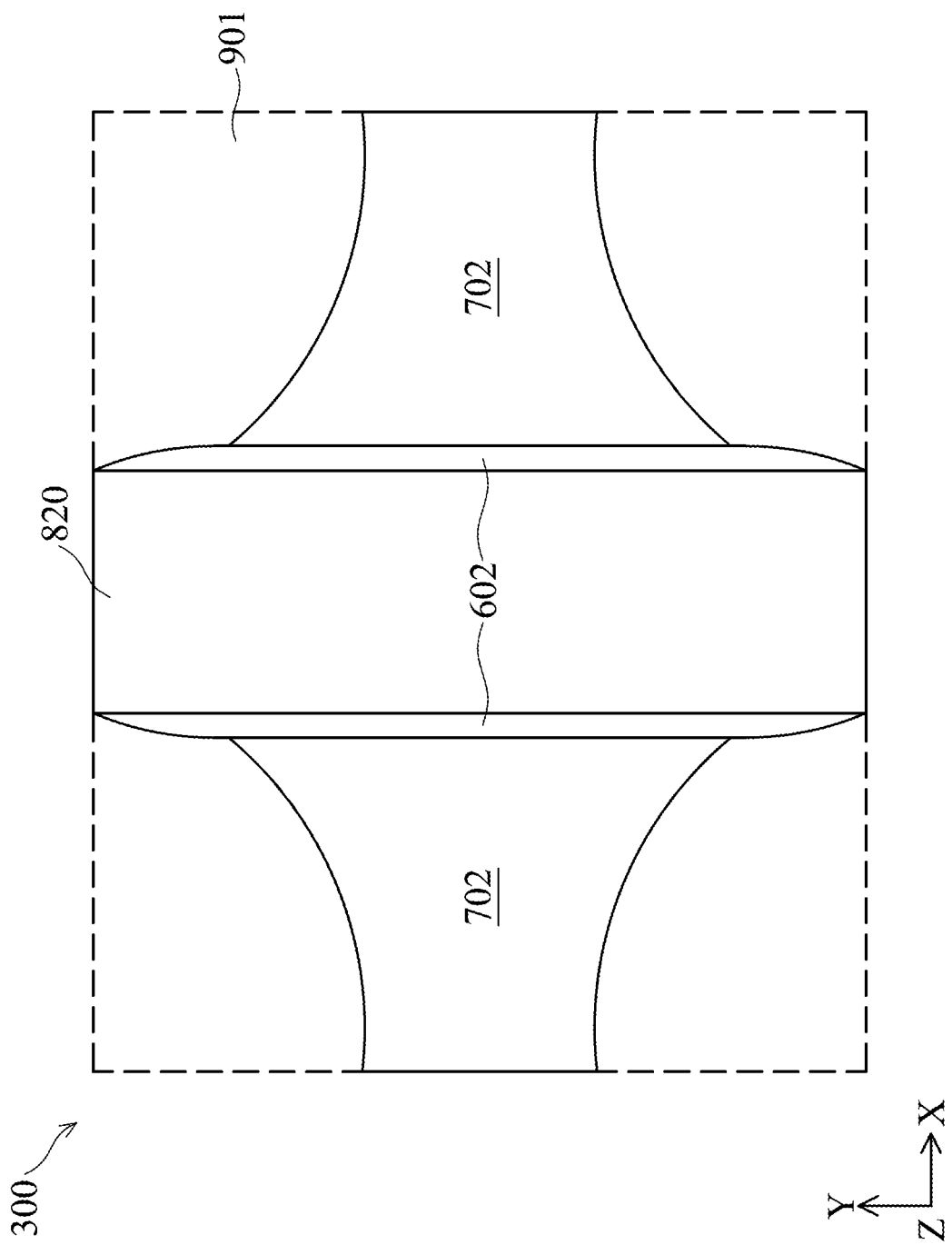

FIG. 9D illustrates another embodiment to form the recess 901, in which the connected layer 602 may remain substantially intact during the pull-back process. As such, the connected layer 602 may wholly extend the sidewalls of the nanostructure 820, when compared to the embodiment of FIG. 9B where the connected layer 602 may partially extend the sidewalls of the nanostructure 820. FIG. 9E illustrates yet another embodiment to form the recess 901, in which the connected layer 602 may be etched during the pull-back process but in a slower etching rate, when compared to the embodiment of FIG. 9B. For example in FIG. 9E, only end portions of the connected layer 602 (along the Y direction) are partially etched, which causes the connected layer 602 to present a tapered profile. Specifically, the tapered profile may have a varying thickness, at the portion not exposed by the remaining dummy gate structure 702. The thickness can gradually decrease from the portion of the connected layer 602 at around the end of the remaining dummy gate structure 702 toward the end of the connected layer 602.

Figure 10A:
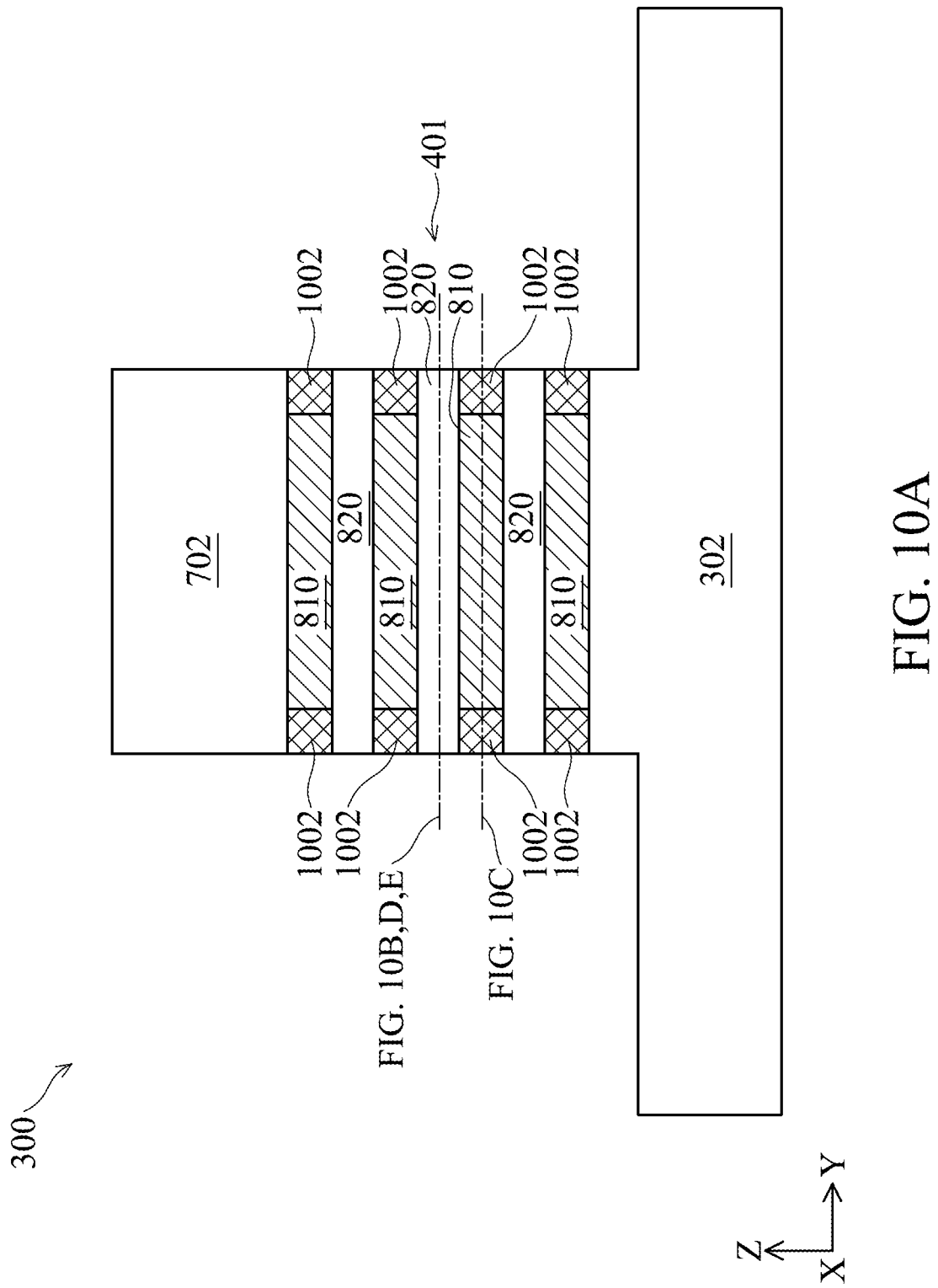
Figure 10B:
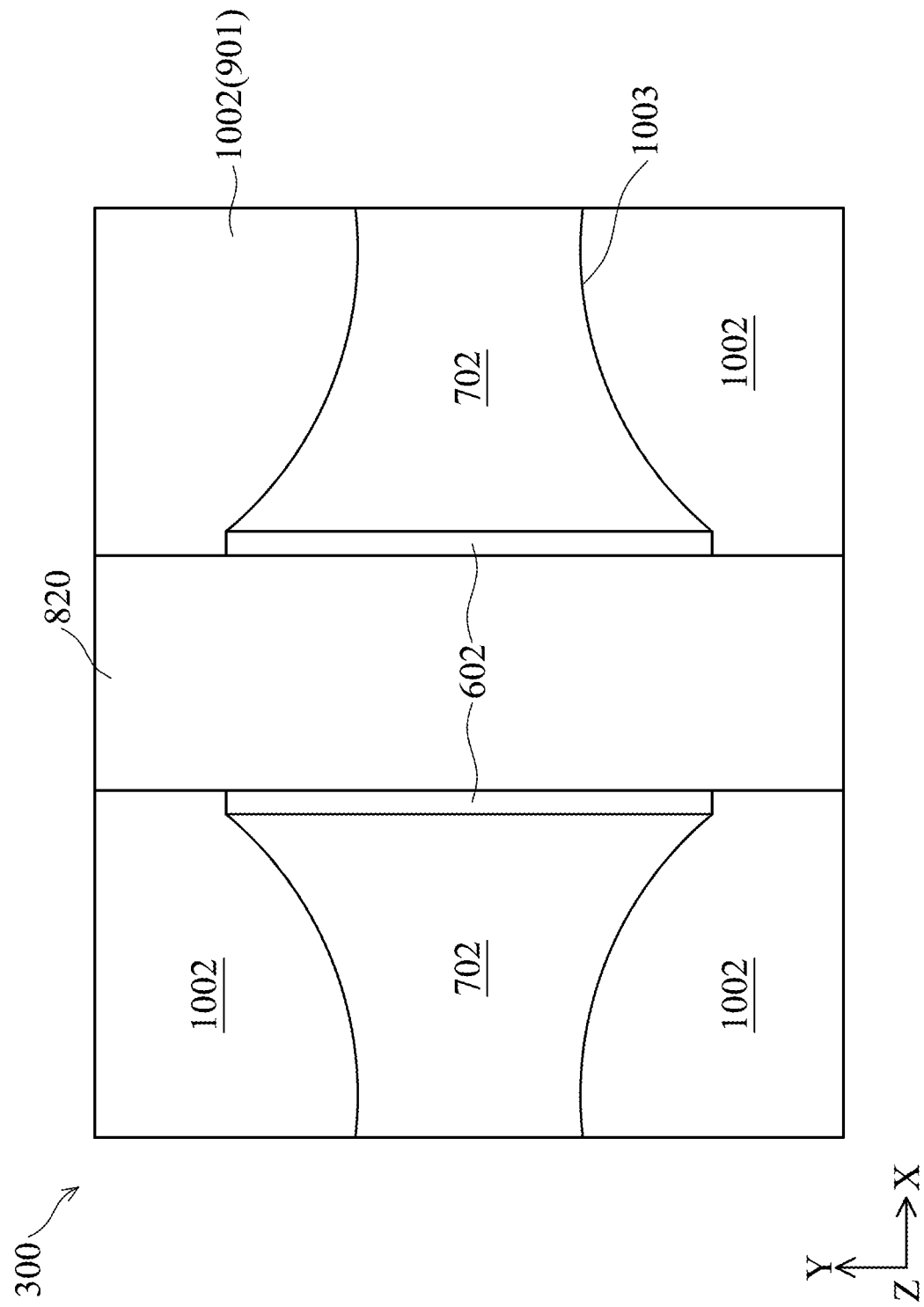
Figure 10C:
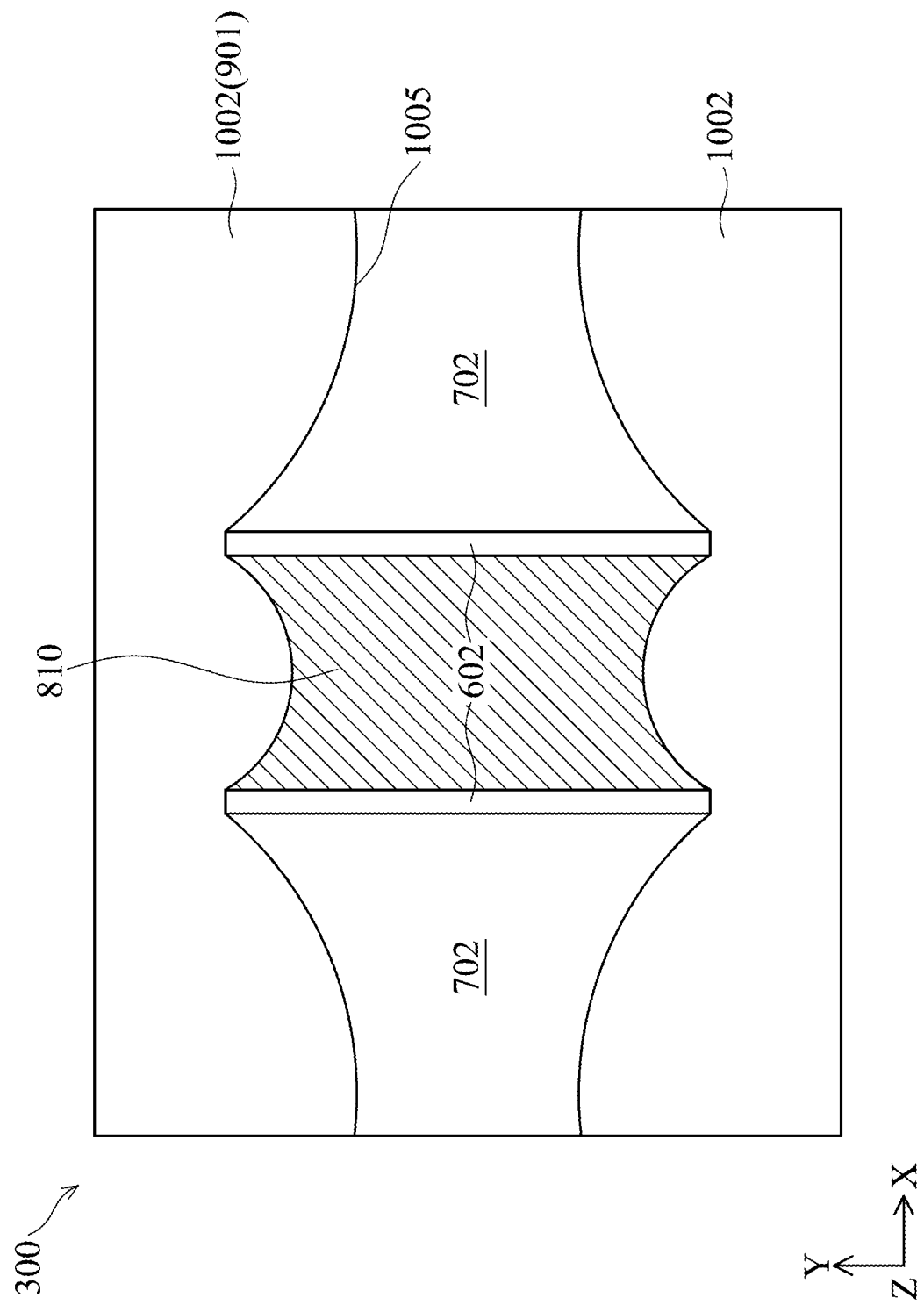

Corresponding to operation 216 of FIG. 2, FIG. 10A is a cross-sectional view of the GAA FET device 300 including an inner spacer 1002, at one of the various stages of fabrication. The cross-sectional view of FIG. 10A is cut in the lengthwise direction of a fin structure of the GAA FET device 300 (e.g., cross-section D-D indicated in FIG. 1). Also corresponding to the same operation 216, FIGS. 10B and 10C depict cross-sectional views of the GAA FET device 300, which are cut along cross-section B-B and cross-section C-C (as indicated in FIG. 1), respectively.

The inner spacer 1002 is formed along respective etched ends of the nanostructures 810. Thus, the inner spacer 1002 (e.g., their respective inner sidewalls) may follow the curvature-based profile (e.g., 903, 905) of the recess 901. For example in FIG. 10B where the inner spacer 1002 follows the curvature-based profile 903 shown in FIG. 9B, a first group of the inner spacer 1002 can present a first curvature-based profile 1003 that is similar to the profile 903. Each of the first group of the inner spacer 1002 may be laterally aligned with a corresponding one of the nanostructures 820. For example in FIG. 10C where the inner spacer 1002 follows the curvature-based profile 905 shown in FIG. 9C, a second group of the inner spacer 1002 can present a second curvature-based profile 1005 that is similar to the profile 905. Each of the second group of the inner spacer 1002 may be laterally aligned with a corresponding one of the nanostructures 810.

In some embodiments, the inner spacer 1002 can be formed conformally by chemical vapor deposition (CVD), or by monolayer doping (MLD) of nitride followed by spacer ME. The inner spacer 1002 can be deposited using, e.g., a conformal deposition process and subsequent isotropic or anisotropic etch back to remove excess spacer material on the sidewalls of the stacks of the fin structure 401 and on a surface of the semiconductor substrate 302. The inner spacer 1002 can be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Figure 10D:
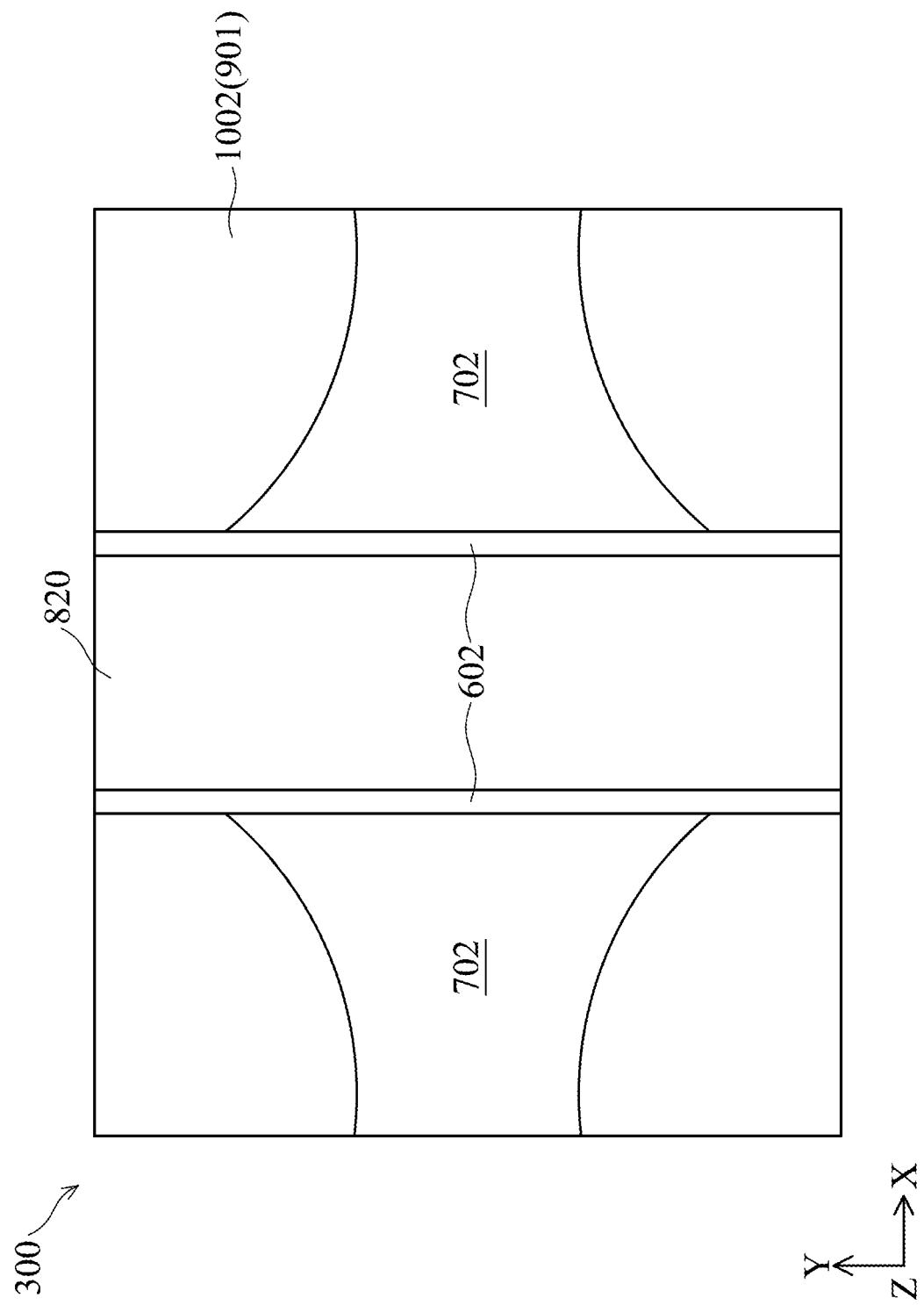
Figure 10E:
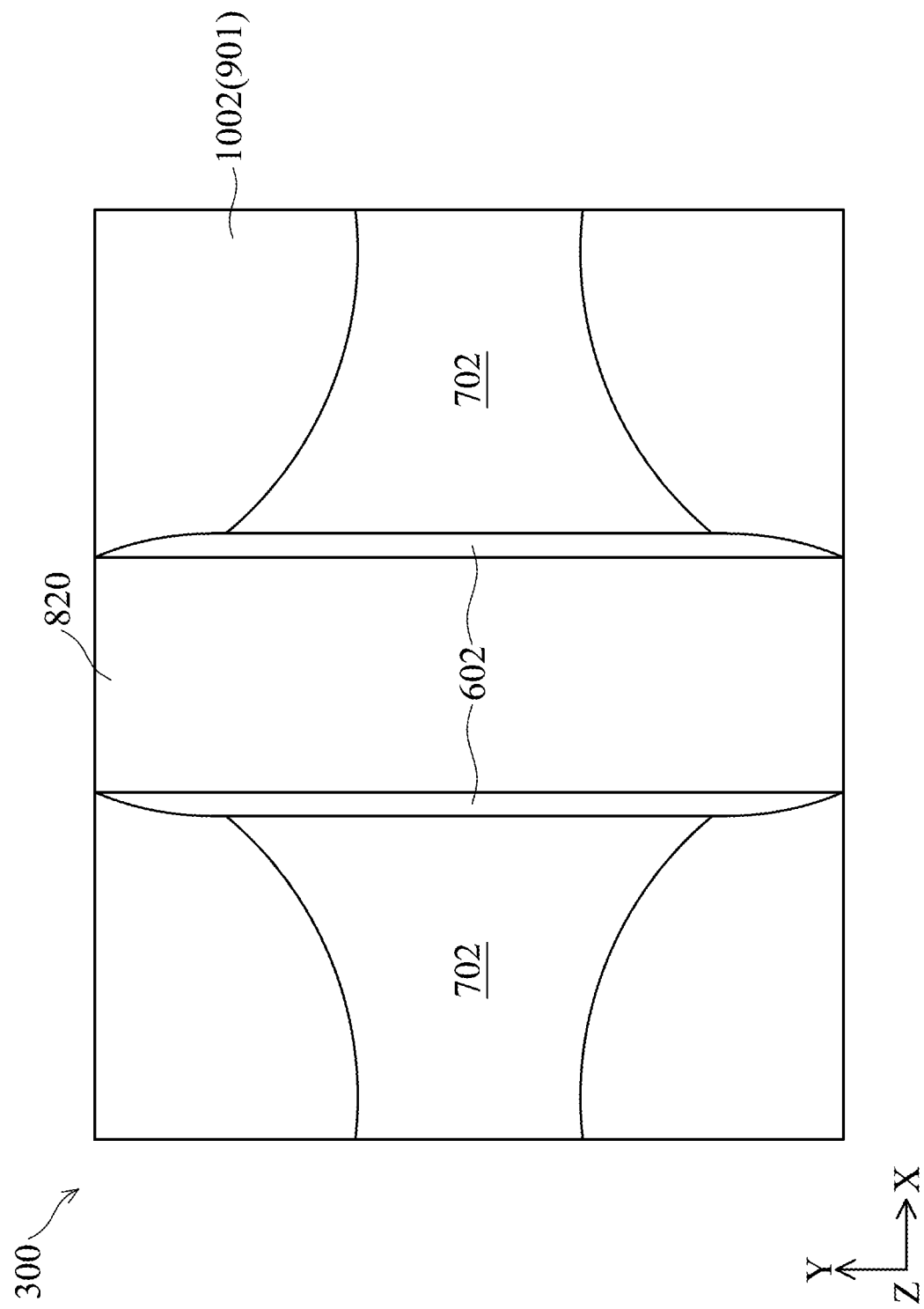

FIGS. 10D and 10E illustrate other embodiments of the profile of the inner spacer 1002. As shown in FIG. 10D, the inner spacer 1002 follows the profile of the recess 901, as shown in FIG. 9D. As such, the inner spacer 1002 may be separated from the nanostructure 820 with the intact connected layer 602. As shown in FIG. 10E, the inner spacer 1002 follows the profile of the recess 901, as shown in FIG. 9E. As such, the inner spacer 1002 may be separated from the nanostructure 820 with the tapered connected layer 602. Although the sidewalls of the nanostructure 820 are not exposed by the tapered connected layer 602 in the illustrated embodiment of FIG. 10E, it should be understood that portions (e.g., one or more end portions) of the sidewalls of the nanostructure 820 may be in direct contact with the inner spacer 1002, while remaining within the scope of the present disclosure.

Figure 11A:
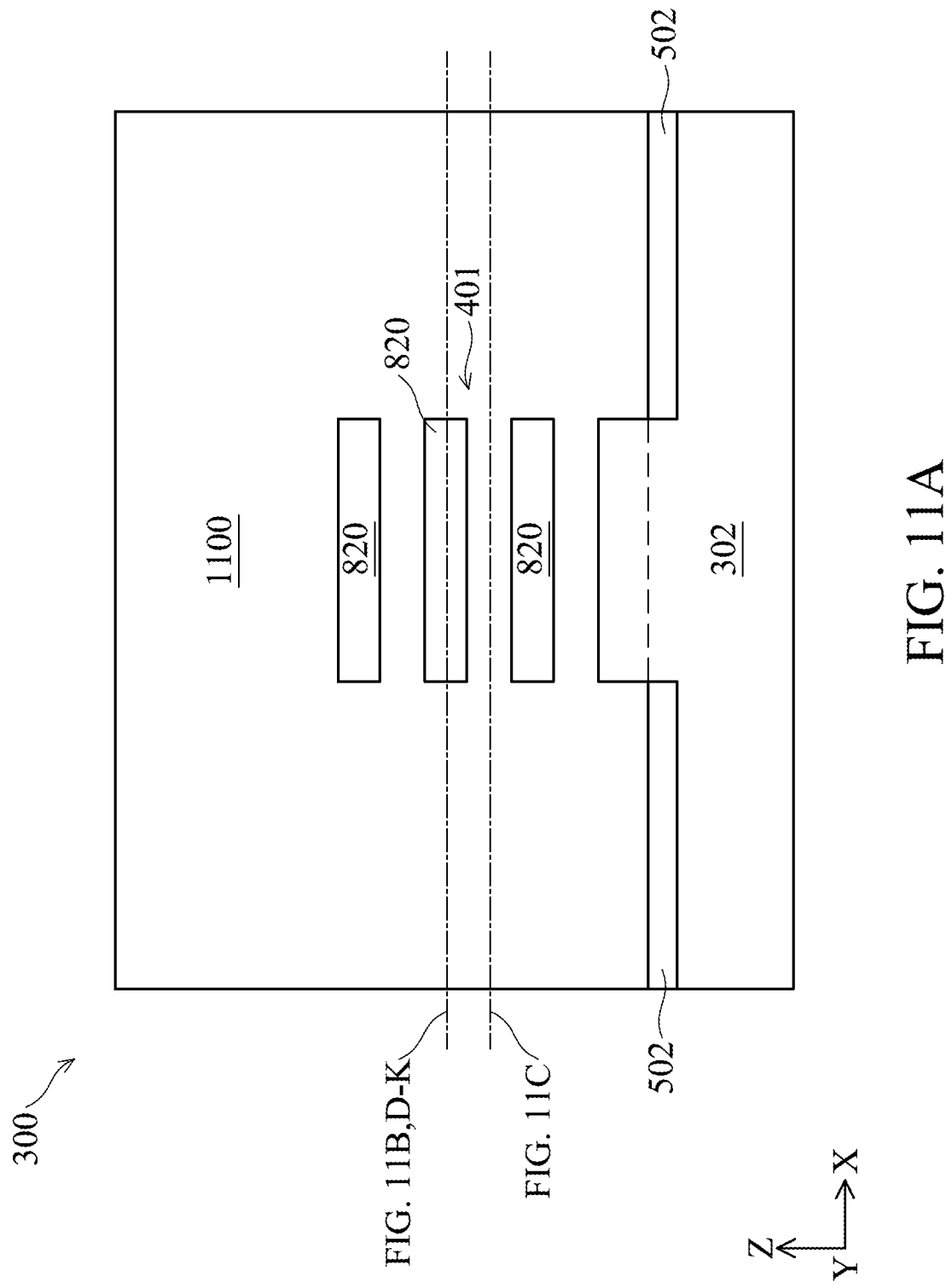
Figure 11B:
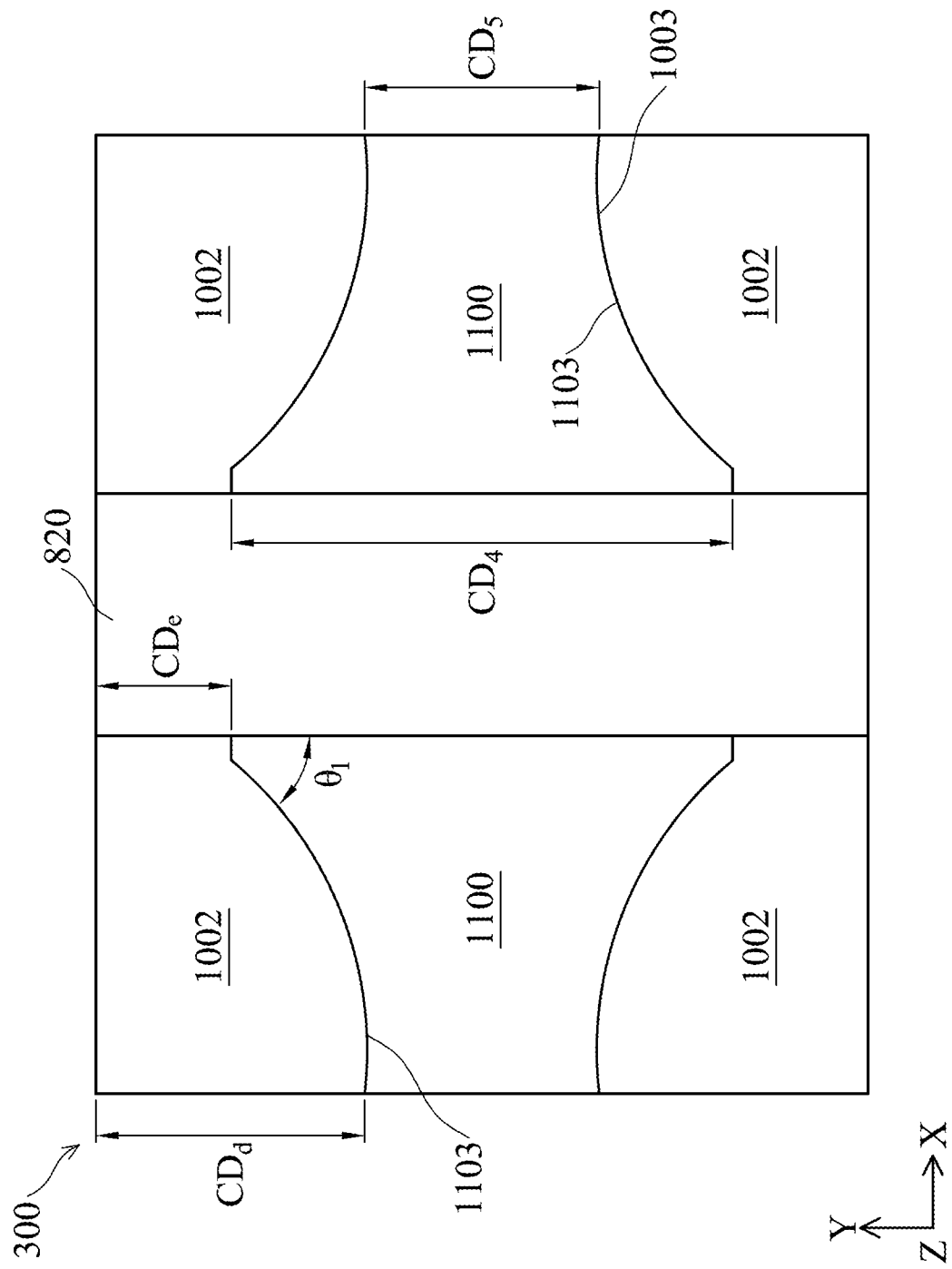

Corresponding to operation 218 of FIG. 2, FIG. 11A is a cross-sectional view of the GAA FET device 300 including an active gate structure 1100, at one of the various stages of fabrication. The cross-sectional view of FIG. 11A is cut in the lengthwise direction of an active/dummy gate structure of the GAA FET device 300 (e.g., cross-section A-A indicated in FIG. 1). Also corresponding to the same operation 218, FIGS. 11B and 10C depict cross-sectional views of the GAA FET device 300, which are cut along cross-section B-B and cross-section C-C (as indicated in FIG. 1), respectively.

Subsequently to forming source/drain structures on the sides of the fin structure 401 (along the Y direction) and an ILD overlaying the source/drain structures, both of which are not shown for purposes of clarity of illustration, the dummy gate structure 702 (or at least its lower portion that is formed of the similar material as the nanostructures 810), the nanostructures 810, and selectively at least a portion of the connected layer 602 may be concurrently removed. In various embodiments, the dummy gate structure 702 (or at least its lower portion) and the nanostructures 810 can be removed by applying a selective etch (e.g., a hydrochloric acid (HCl)), while leaving the nanostructures 820 substantially intact. After the removal of the dummy gate structure 702, a gate trench, exposing respective sidewalls of each of the nanostructures 820 that face the X direction, may be formed. After the removal of the nanostructures 810 to further extend the gate trench, respective bottom surface and/or top surface of each of the nanostructures 820 may be exposed. Consequently, a full circumference of each of the nanostructures 820 can be exposed. Next, the active gate structure 1100 is formed to wrap around each of the nanostructures 820.

The active gate structure 1100 is formed in the extended gate trench by filling with at least a gate dielectric and a gate metal. Thus, the active gate structure 1100 can inherit the dimensions and profiles of the gate trench, which are defined by the formed inner spacer 1002, the removed dummy gate structure 702, the removed nanostructures 810, and selectively the removed portion of the connected layer 602. FIG. 11B illustrates an embodiment where the connected layer 602 is wholly removed, after removing the dummy gate structure 702 shown in FIG. 10B. As such, each of a number of first gate sections of the active gate structure 1100 can present a first curvature-based profile 1103 at its respective ends that extend along the X direction. Each of the first gate sections is laterally aligned with a corresponding one of the nanostructures 820. The first curvature-based profile 1103 can follow the profile 1003 of the inner spacer 1002 and further extends toward the nanostructure 820 through the wholly removed connected layer 602. On the other hand, the connected layer 602 may not remain along the nanostructures 810. For example in FIG. 11C, each of a number of second gate sections of the active gate structure 1100 can present a second curvature-based profile 1105 at its respective ends that extend along the X direction. Each of the second gate sections is laterally aligned with a corresponding one of the removed nanostructures 810. The second curvature-based profile 1105 can follow the profile 1005 of the inner spacer 1002.

In various embodiments, the active gate structure 1100 and the inner spacer 1002 may be characterized with one or more critical dimensions (CDs). For example in FIG. 11B, the active gate structure 1100 can be characterized with $CD_4$ and $CD_5$, which correspond to lengths of the sidewalls of the active gate structure 1100 extending along the Y direction, respectively; and the inner spacer 1002 can be characterized with $CD_d$ and $CD_e$, which correspond to lengths of the sidewalls of the inner spacer 1002 extending along the Y direction, respectively. The sidewalls of the active gate structure 1100, having $CD_4$ and $CD_5$, respectively, are connected to each other through the inwardly curved arc (e.g., profile 1103). Accordingly, $CD_4$ is greater than $CD_5$. In a non-limiting example, $CD_4$ and $CD_5$ may each range from about 2 nanometers (nm) to about 300 nm. The sidewalls of the inner spacer 1002, having $CD_d$ and $CD_e$, respectively, are connected to each other through the inwardly curved arc (e.g., profile 1103). Accordingly, $CD_d$ is greater than $CD_e$. In a non-limiting example, $CD_d$ and $CD_e$ may each range from about 0.3 nanometers (nm) to about 15 nm. Further, the profile 1103 can inherit the profile 903 (FIG. 9B), and thus, the angle $\theta_1$ present between the sidewall of the nanostructure 820 extending along the Y direction and the profile 1103 can be reserved. In some embodiments, the angle $\theta_1$ is less than 90 degrees. For example, the angle $\theta_1$ may range from about 30 degrees to about 88 degrees.

Figure 11C:
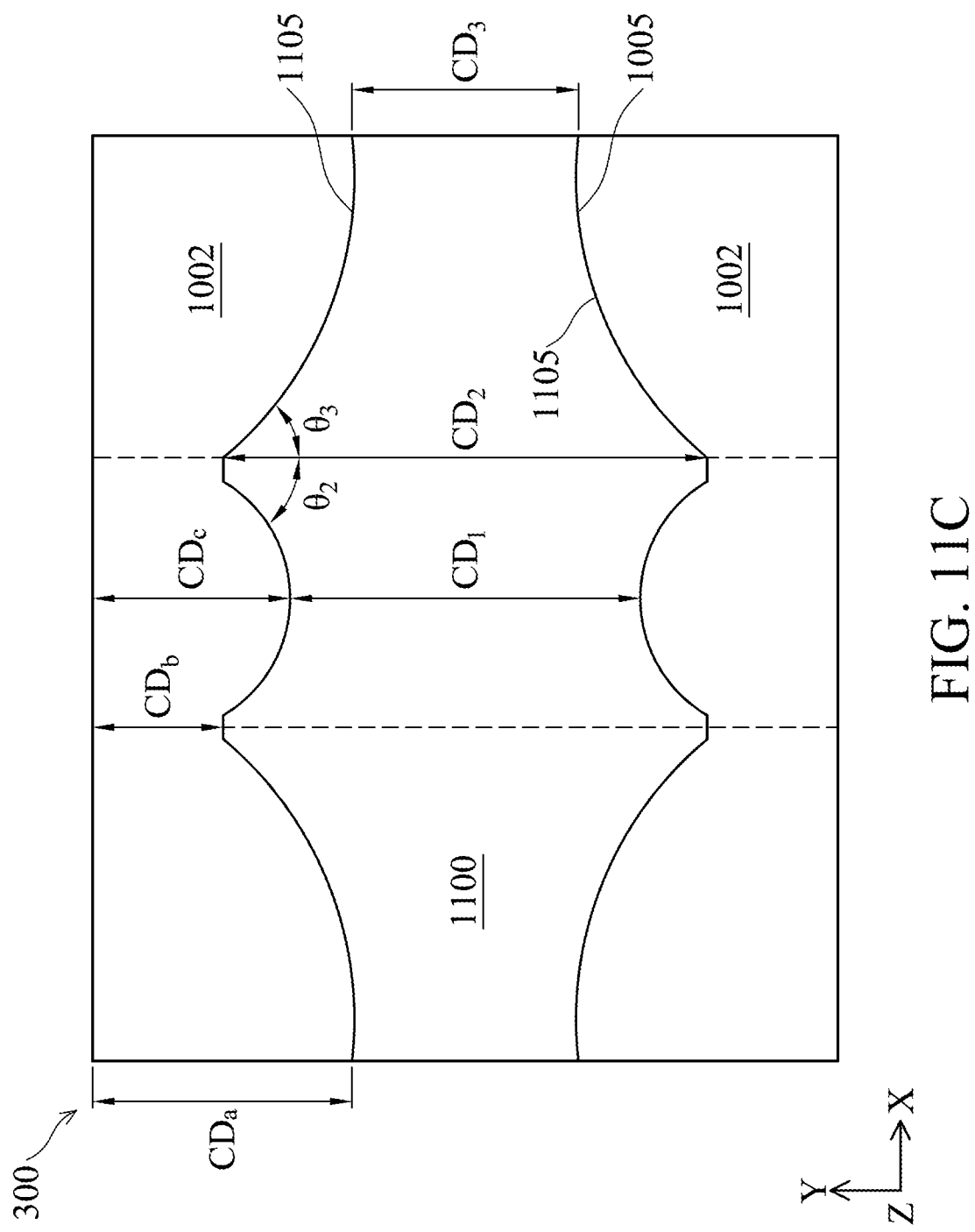
Figure 11D:
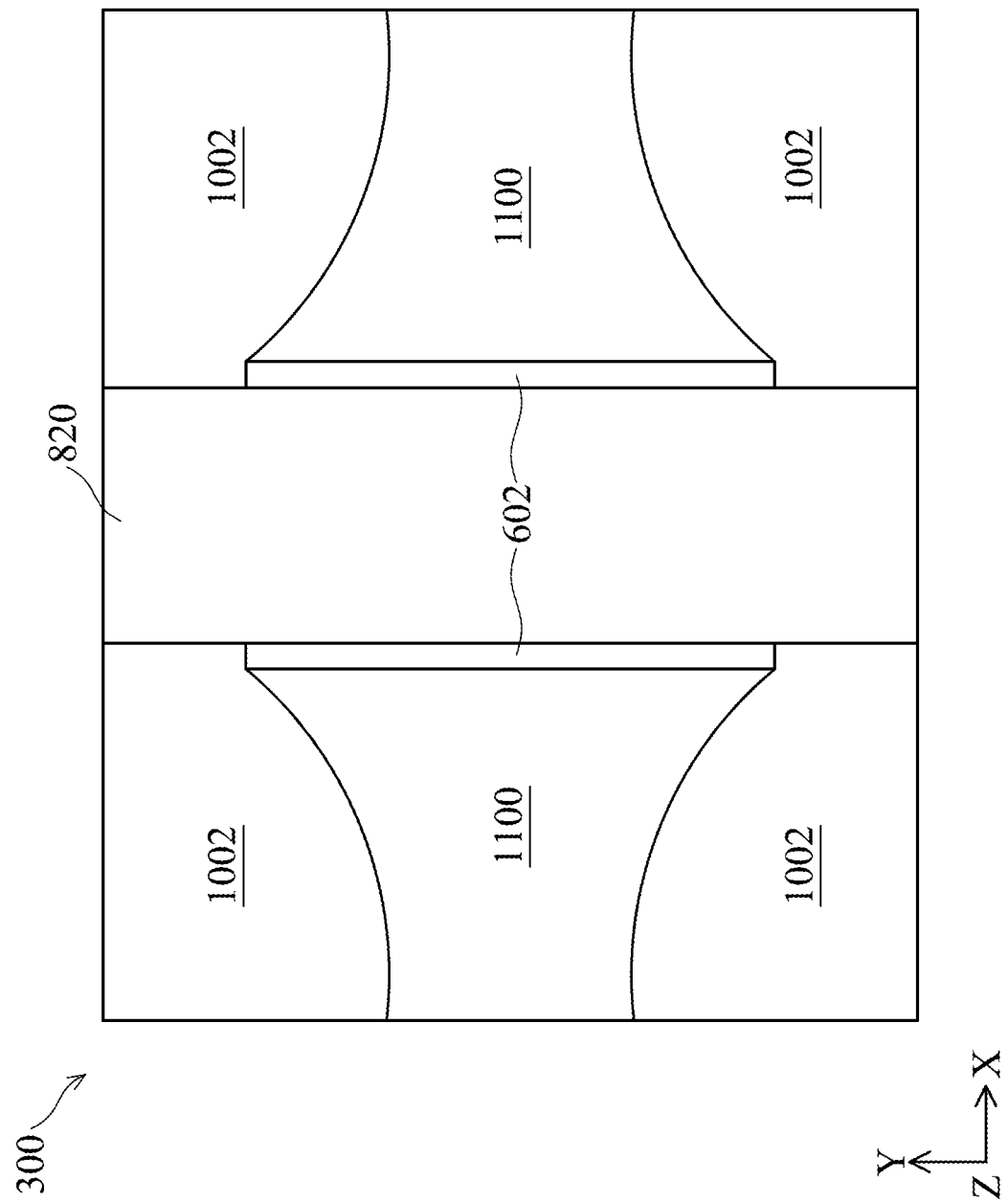

For example in FIG. 11C, the active gate structure 1100 can be characterized with $CD_1$, $CD_2$, and $CD_3$, which correspond to lengths of different portions of the active gate structure 1100 extending along the Y direction, respectively; and the inner spacer 1002 can be characterized with $CD_a$, $CD_b$, and $CD_c$, which correspond to different portions of the inner spacer 1002 extending along the Y direction, respectively. The portion of the active gate structure 1100, having $CD_1$, may be located between respective middle points of the middle arcs on its opposite sides; the portion of the active gate structure 1100, having $CD_2$, may be located between junctions of the adjacent arcs on its opposite sides; and the portion of the active gate structure 1100, having $CD_3$, may be located between respective end points of the side arcs. In some embodiments, $CD_2$ is greater than $CD_1$ and $CD_3$ is greater than $CD_1$. In a non-limiting example, $CD_1$, $CD_2$ and $CD_3$ may each range from about 2 nanometers (nm) to about 300 nm. The portion of the active gate structure 1100, having $CD_1$, may be located between respective middle points of the middle arcs on its opposite sides; the portion of the active gate structure 1100, having $CD_2$, may be located between junctions of the adjacent arcs on its opposite sides; and the portion of the active gate structure 1100, having $CD_3$, may be located between respective end points of the side arcs. In some embodiments, $CD_2$ is greater than $CD_1$ and $CD_3$ is greater than $CD_1$. In a non-limiting example, $CD_1$, $CD_2$, and $CD_3$ may each range from about 2 nanometers (nm) to about 300 nm. The portion of the inner spacer 1002, having $CD_c$, may be extended from the middle point of the middle arc; the portion of the inner spacer 1002, having $CD_b$, may be extended from the junction of the adjacent arcs; and the portion of the inner spacer 1002, having $CD_a$, may be extended from the end point of the side arc. In some embodiments, $CD_a$ is greater than $CD_b$ and $CD_c$ is greater than $CD_b$. In a non-limiting example, $CD_a$, $CD_b$, and $CD_c$ may each range from about 0.3 nanometers (nm) to about 15 nm. Further, the profile 1105 can inherit the profile 905 (FIG. 9C), and thus, the angles $\theta_2$ and $\theta_3$ can be reserved. In some embodiments, the angles $\theta_2$ and $\theta_3$ are each less than 90 degrees. For example, the angles $\theta_2$ and $\theta_3$ may each range from about 30 degrees to about 88 degrees.

The active gate structure 1100 includes a gate dielectric and a gate metal, in some embodiments. The gate dielectric can wrap around each of the nanostructures 820, e.g., the top and bottom surfaces and sidewalls facing the X direction). The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the nanostructures 820.

The gate metal can wrap around each of the nanostructures 820 with the gate dielectric disposed therebetween. Specifically, the gate metal can include a number of gate metal sections abutted to each other along the Z direction. Each of the gate metal sections can extend not only along a horizontal plane (e.g., the plane expanded by the X direction and the Y direction), but also along a vertical direction (e.g., the Z direction). As such, two adjacent ones of the gate metal sections can adjoin together to wrap around a corresponding one of the nanostructures 820, with the gate dielectric disposed therebetween.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

Figure 11E:
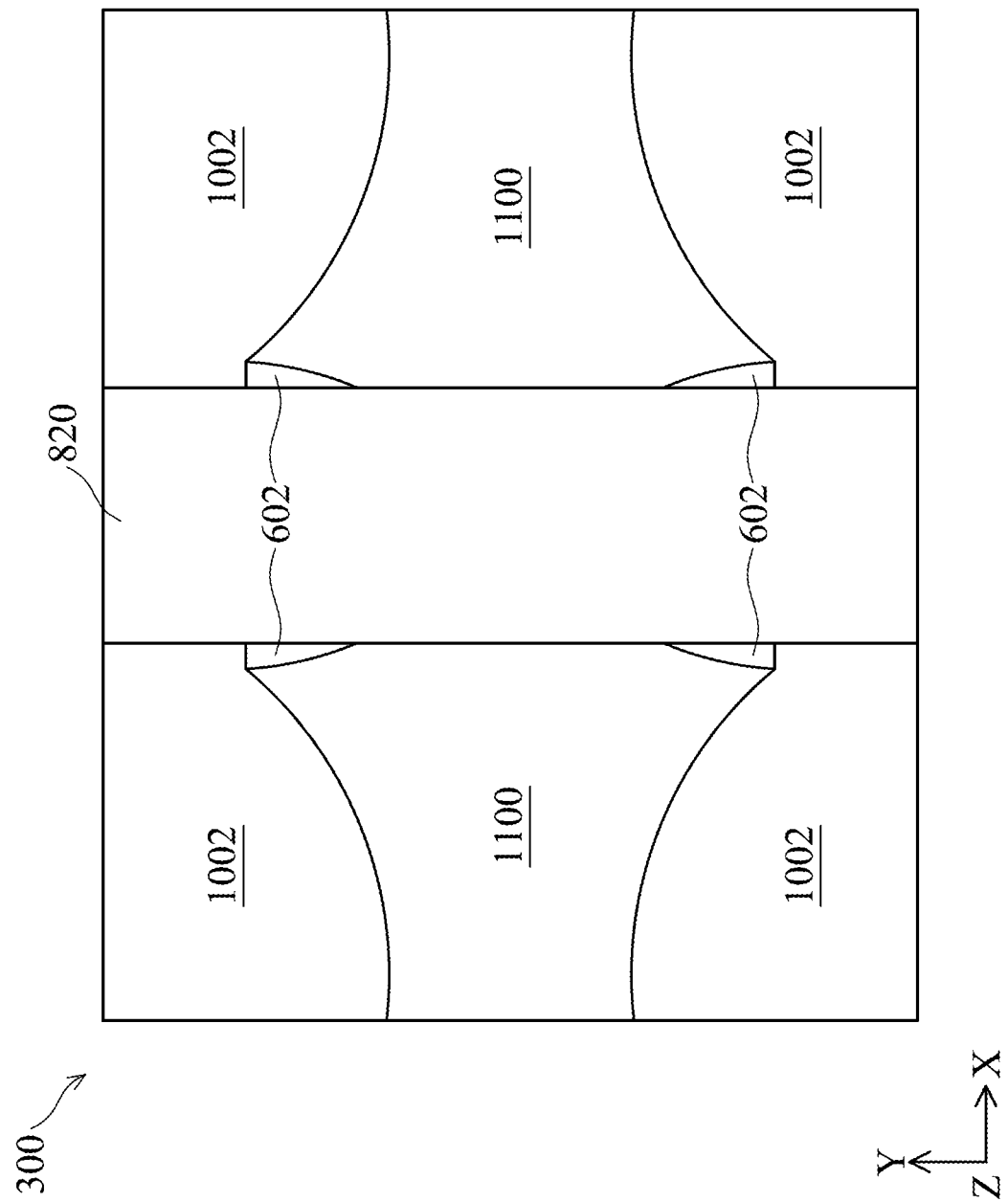
Figure 11F:
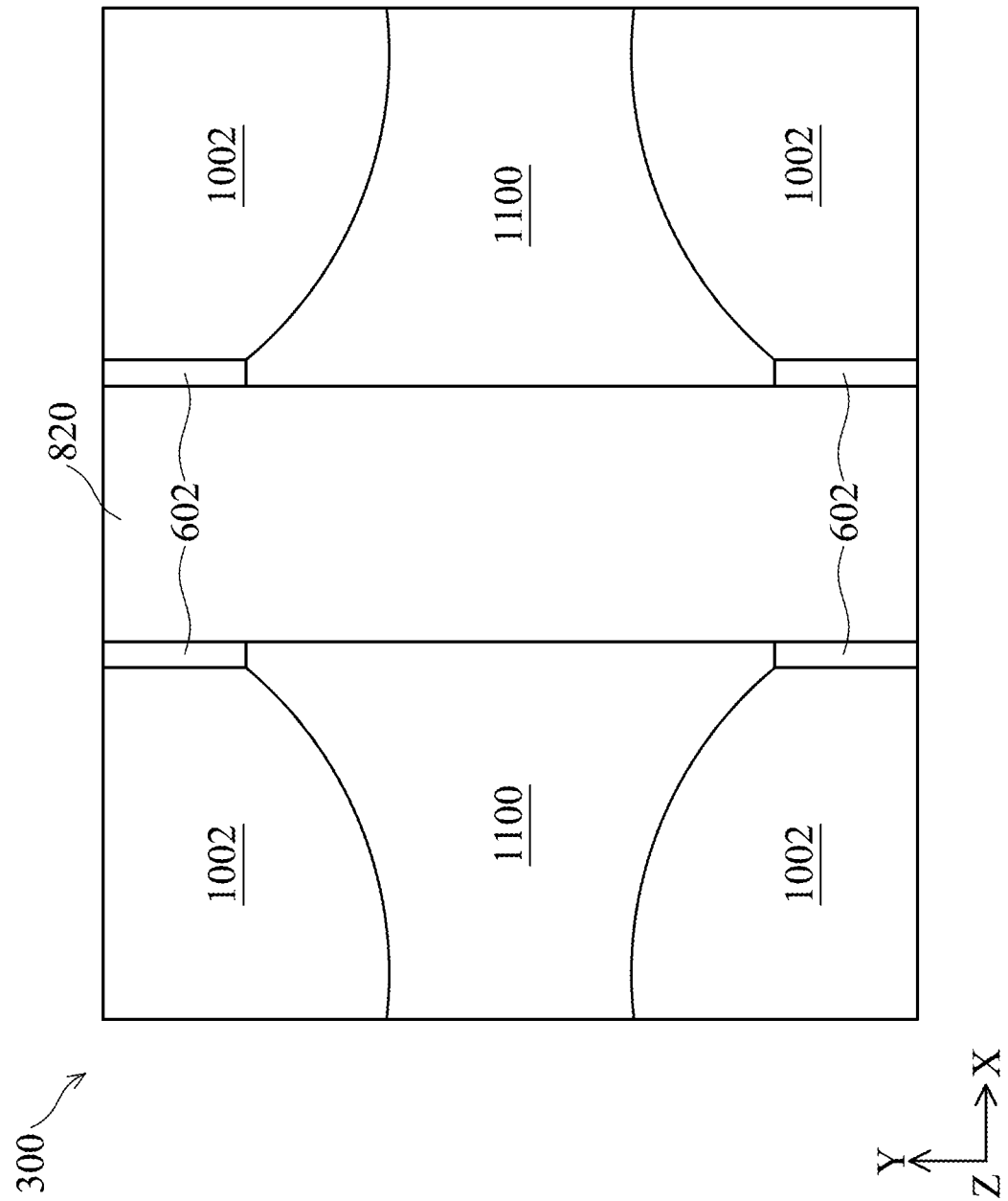
Figure 11G:
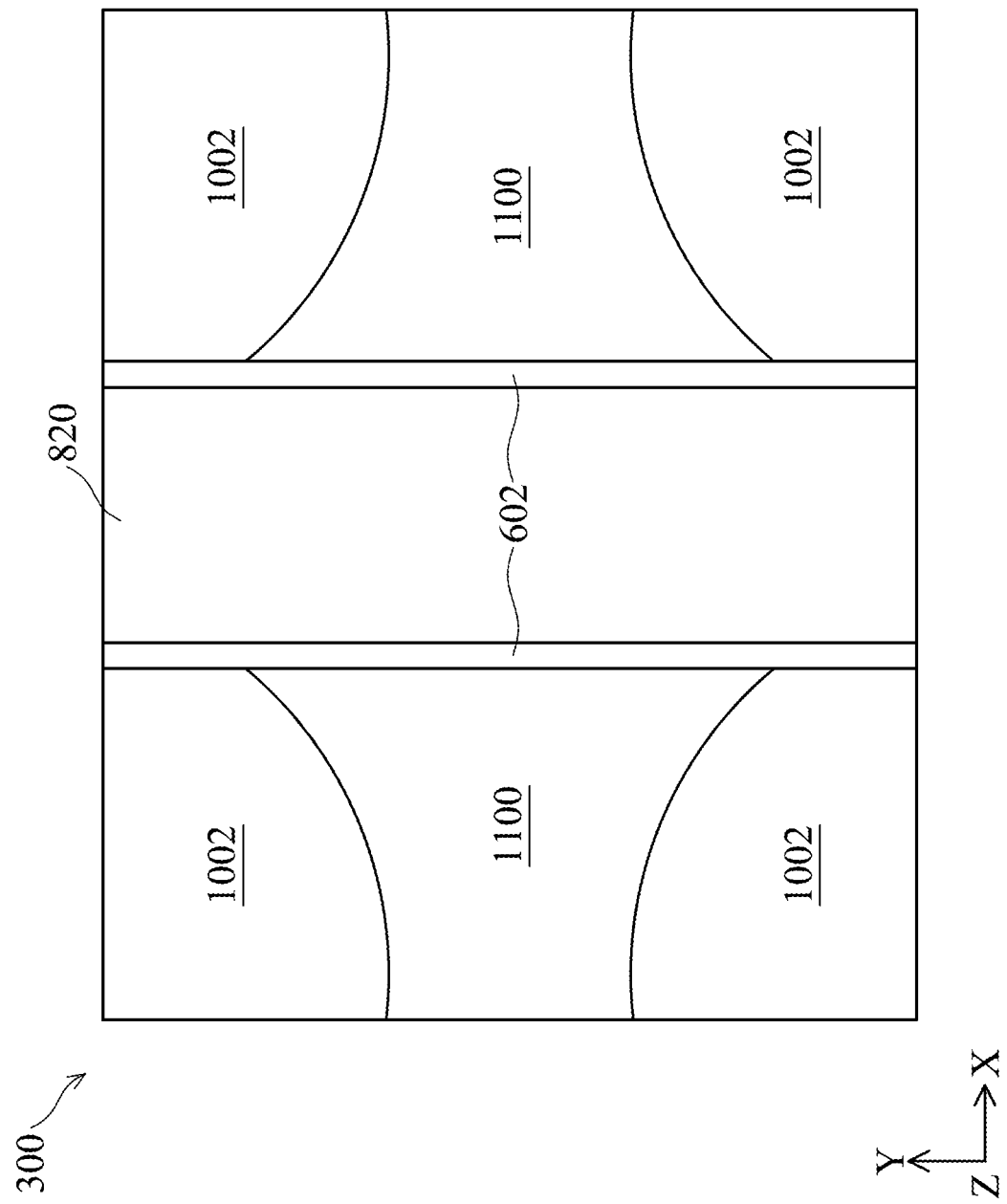
Figure 11H:
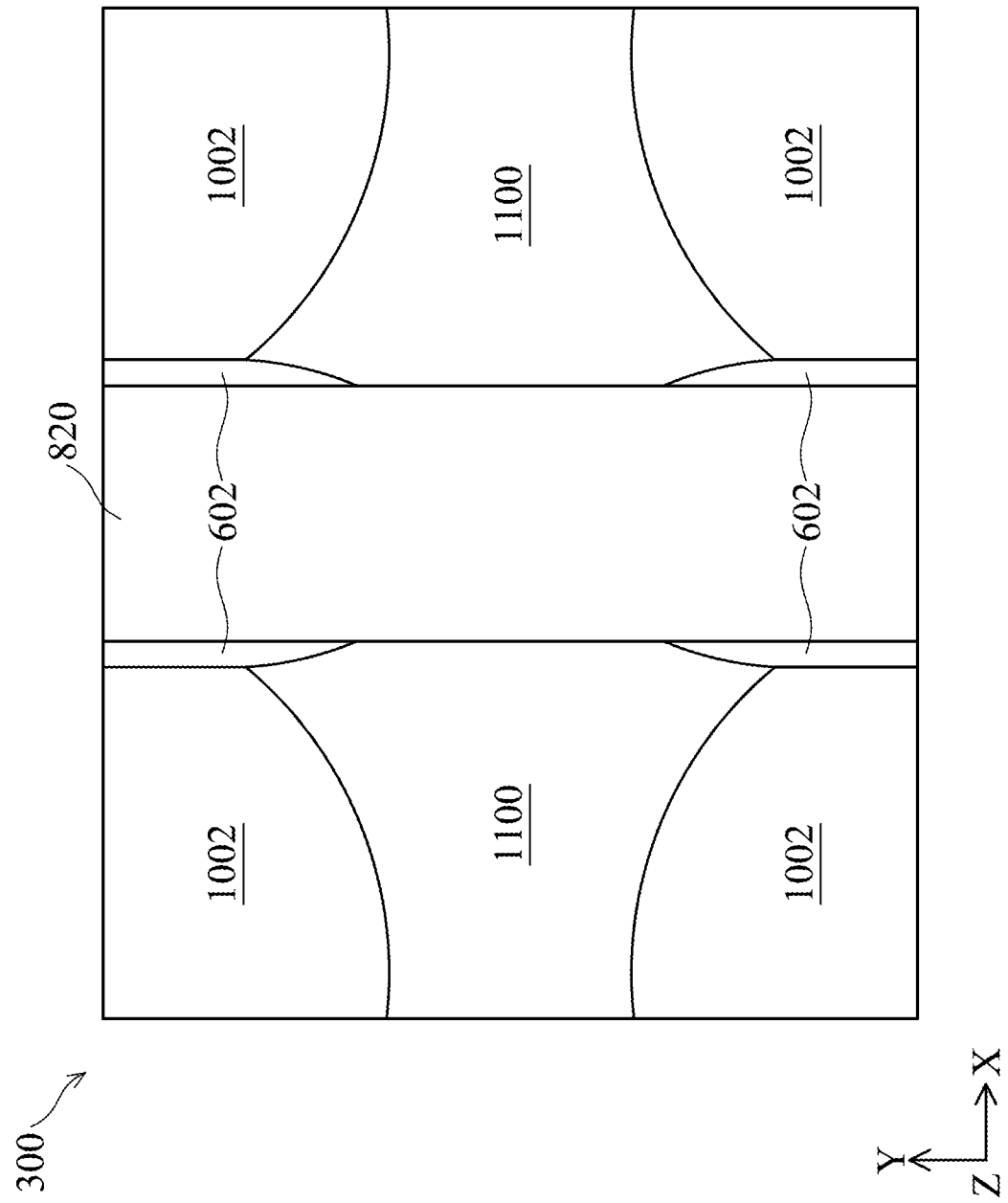
Figure 11I:
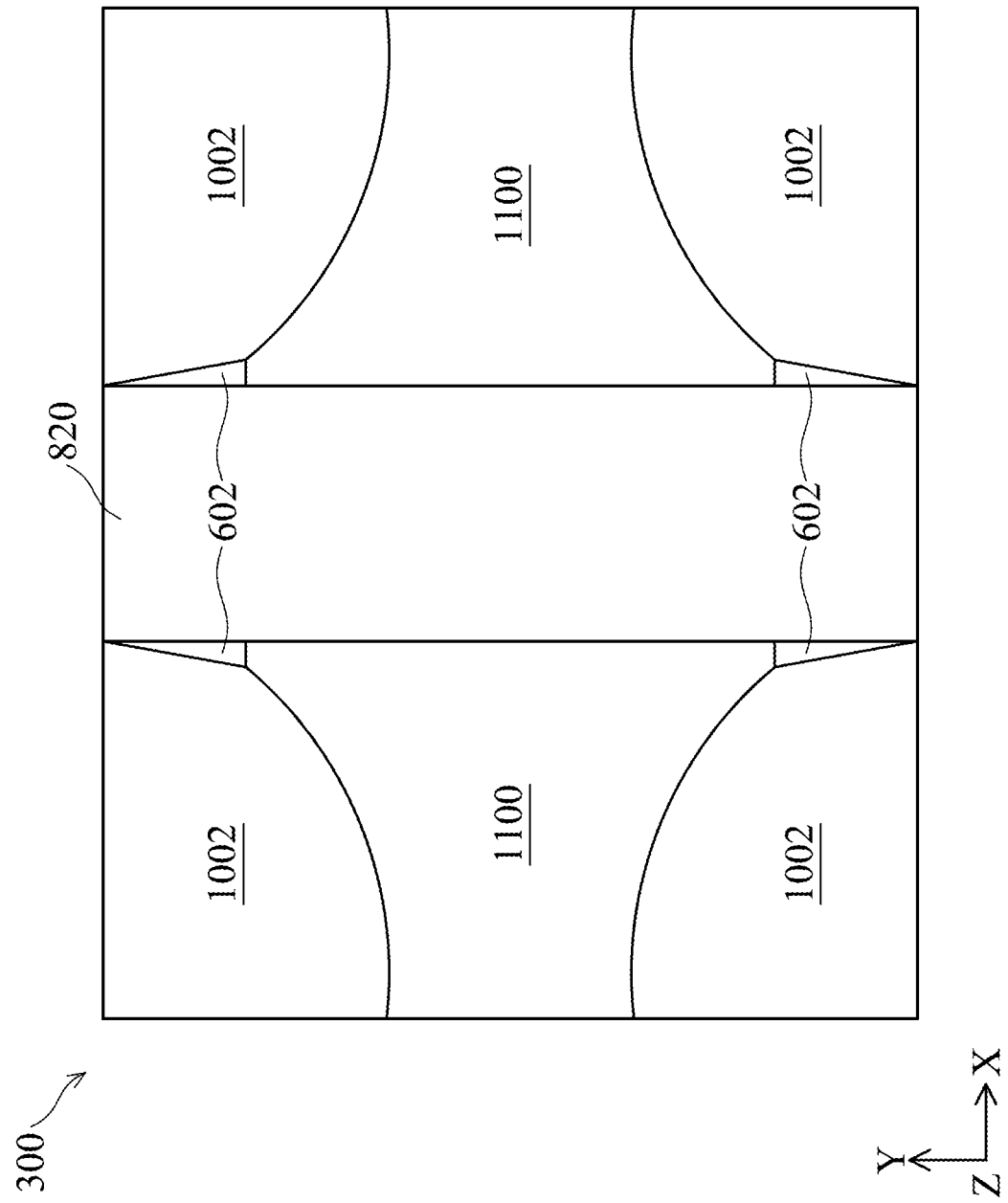
Figure 11J:
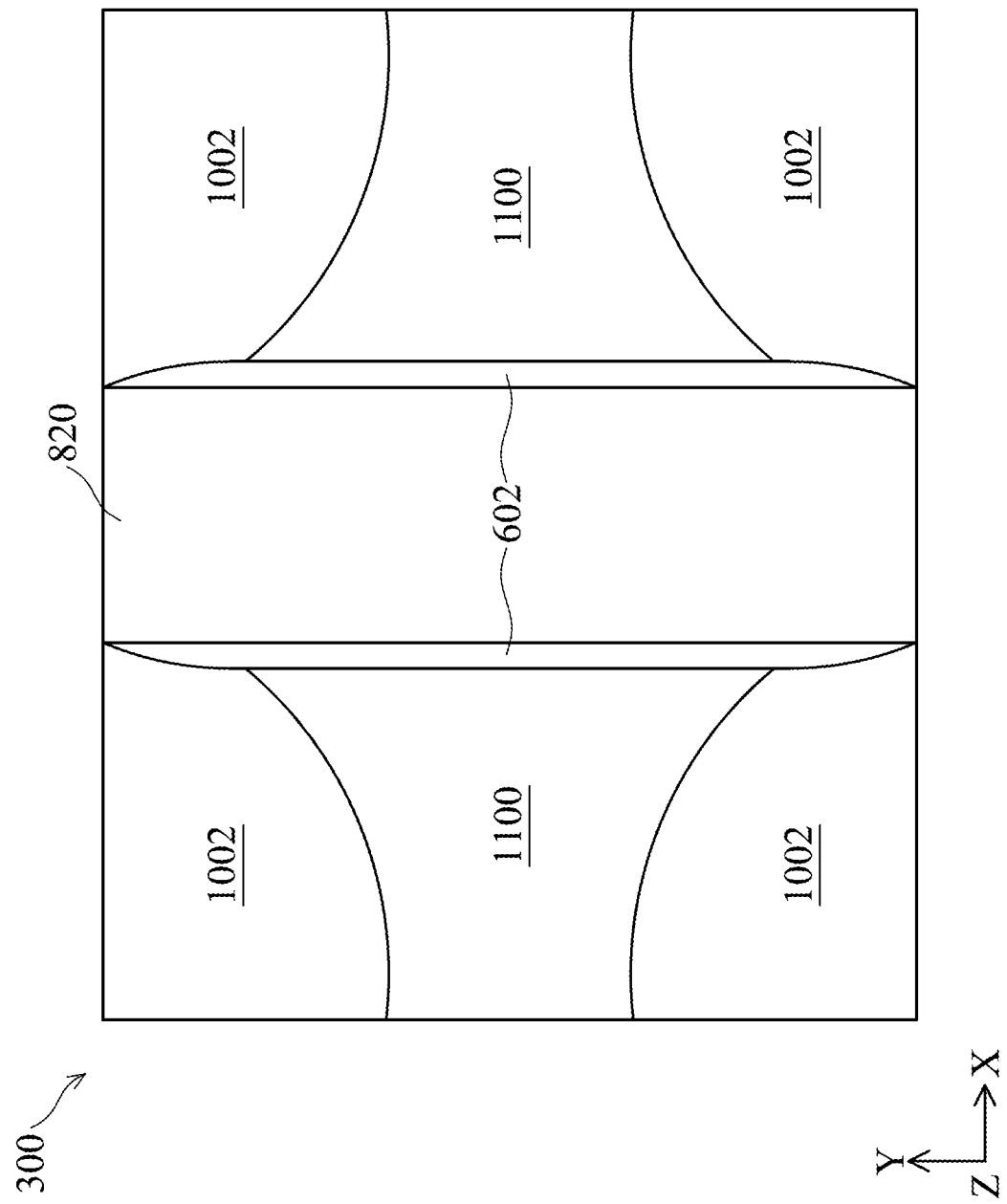
Figure 11K:
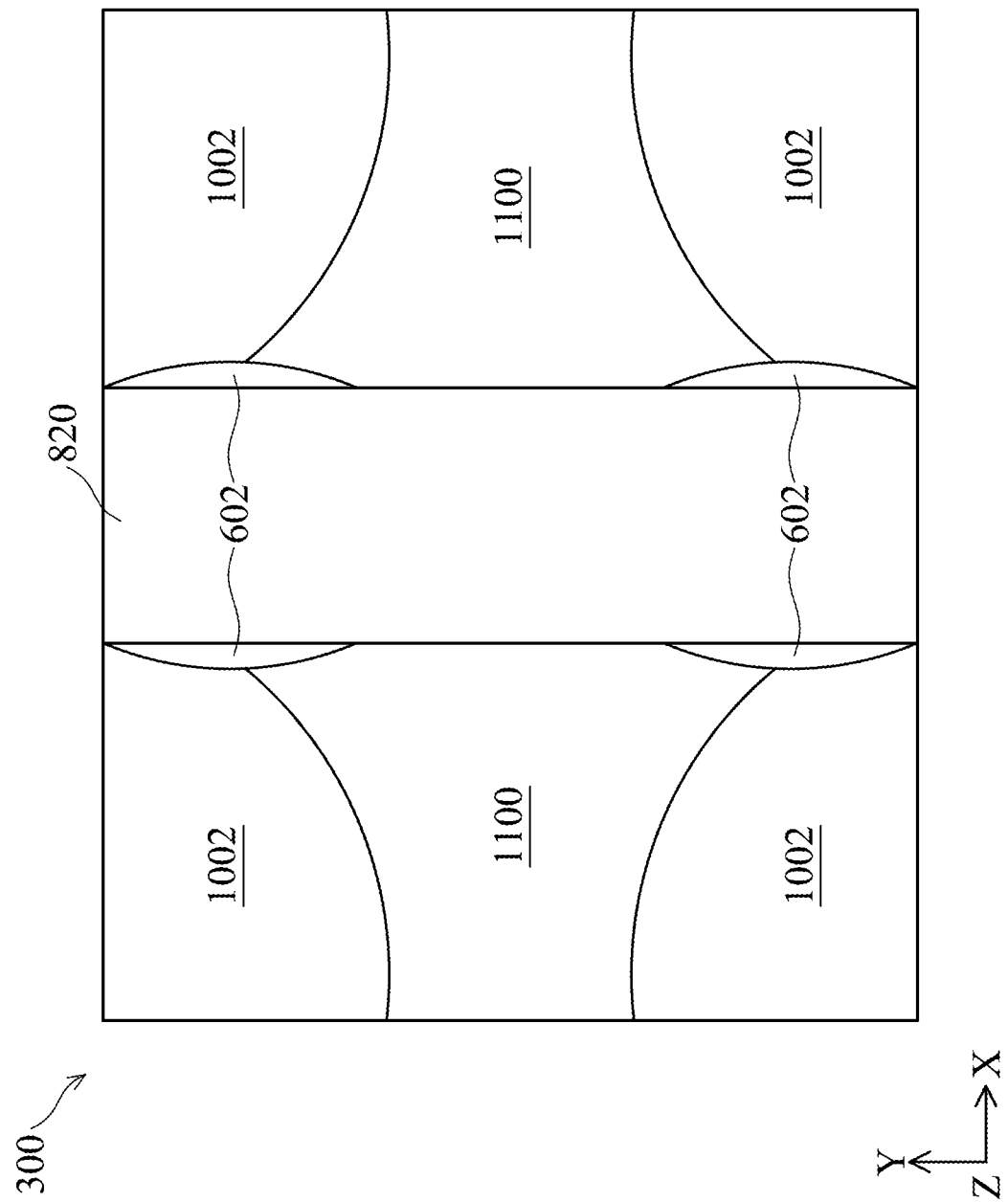

FIGS. 11D-K illustrate various other embodiments where the connected layer 602 is partially removed from or remains substantially intact along the sidewalls of the nanostructures 820, after forming the active gate structure 1100. For example in FIG. 11D, the whole remaining portion of the connected layer 602 that is not exposed by the remaining dummy gate structure 702 (when forming the recess 901 in FIG. 9B), may remain. In FIG. 11E, one or more tapered portions of the connected layer 602 may remain. Specifically, each of such tapered portions is disposed between the nanostructure 820 and the active gate structure 1100, and the tapered portions on the same side of the nanostructure 820 are tapered toward each other. In FIG. 11F, one or more non-tapered portions of the connected layer 602 may remain. Specifically, each of such non-tapered portions is disposed between the nanostructure 820 and the inner spacer 1002. In FIG. 11G, the whole connected layer 602 may remain. In FIG. 11H, one or more tapered portions of the connected layer 602 may remain. Specifically, each of such tapered portions is disposed between the nanostructure 820 and combination of a portion of the active gate structure 1100 and the inner spacer 1002. The tapered portions on the same side of the nanostructure 820 are tapered toward each other. In FIG. 11I, one or more tapered portions of the connected layer 602 may remain. Specifically, each of such tapered portions is disposed between the nanostructure 820 and the inner spacer 1002, and the tapered portions on the same side of the nanostructure 820 are tapered away from each other. In FIG. 11J, the whole connected layer 602 may remain. Different form the embodiment of FIG. 11G, the connected layer 602 may present a tapered profile toward its both ends. In FIG. 11K, one or more tapered portions of the connected layer 602 may remain. Specifically, each of such tapered portions is disposed between the nanostructure 820 and combination of a portion of the active gate structure 1100 and the inner spacer 1002. Each of the tapered portions has its ends tapered away from each other.

In one aspect of the present disclosure, a semiconductor device is disclosed. The semiconductor device includes a plurality of semiconductor layers vertically separated from one another. Each of the plurality of semiconductor layers extends along a first lateral direction. The semiconductor device includes a gate structure that extends along a second lateral direction and comprises at least a lower portion that wraps around each of the plurality of semiconductor layers. The lower portion of the gate structure comprises a plurality of first gate sections that are laterally aligned with the plurality of semiconductor layers, respectively, and wherein each of the plurality of first gate sections has ends that each extend along the second lateral direction and present a first curvature-based profile.

In another aspect of the present disclosure, a semiconductor device is disclosed. The semiconductor device includes a plurality of semiconductor layers vertically separated from one another. Each of the plurality of semiconductor layers extends along a first lateral direction. The semiconductor device includes a gate structure that extends along a second lateral direction. The gate structure comprises a plurality of first gate sections and a plurality of second gate sections. The plurality of first gate sections are laterally aligned with the plurality of semiconductor layers, respectively. The plurality of second gate sections are each vertically disposed between adjacent ones of the plurality of semiconductor layers. The semiconductor device includes an inner spacer comprising a first group and a second group. Each of the first group of the inner spacer contacts an end of a corresponding one of the plurality of first gate sections in a first curvature-based profile, and each of the second group of the inner spacer contacts an end of a corresponding one of the plurality of second gate sections in a second curvature-based profile.

In yet another aspect of the present disclosure, a method for fabricating a semiconductor device is disclosed. The method includes forming a fin structure extending along a first lateral direction. The fin structure comprises a plurality of first semiconductor layers and a plurality of second semiconductor layers alternately stacked on top of one another. The method includes forming a connected layer overlaying the fin structure. The method includes forming a dummy gate structure over a portion of the fin structure with the connected layer disposed between the dummy gate structure and the fin structure. The dummy gate structure extends along a second lateral direction perpendicular to the first lateral direction. The method includes removing portions of the fin structure that are not overlaid by the dummy gate structure. The method includes etching, along the first lateral direction, respective end portions of each of the first semiconductor layers, respective end portions of at least lower portions of the dummy gate structure, and end portions of the connected layer. A respective remaining portion of each of the first semiconductor layers and a respective remaining portion of each of the lower portions of the dummy gate structure each present a curvature-based profile. The method includes forming inner spacers that fill the etched end portions of the first semiconductor layers and the etched end portions of the dummy gate structure. The method includes replacing respective remaining portions of the first semiconductor layers and the dummy gate structure with an active gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a plurality of semiconductor layers vertically separated from one another, wherein each of the plurality of semiconductor layers extends along a first lateral direction; and
   a gate structure that extends along a second lateral direction and comprises at least a lower portion that wraps around each of the plurality of semiconductor layers;
   wherein the lower portion of the gate structure includes:
      a plurality of first gate sections, each of the first gate sections having a first curvature-based profile when viewed from its cross-section expanding over the first and second lateral directions; and a plurality of second gate sections, each of the second gate sections having a second, different curvature-based profile when viewed from its cross-section expanding over the first and second lateral directions.

2. The semiconductor device of claim 1, wherein the first curvature-based profile has a single arc, and the second curvature-based profile has a plurality of arcs connected to each other.

3. The semiconductor device of claim 2, wherein each of the plurality of semiconductor layers has sidewalls extending along the first direction, and wherein an angle between a portion of each of the sidewalls that is wrapped by a corresponding one of the plurality of first gate sections and the single arc is less than 90 degrees.

4. The semiconductor device of claim 3, wherein the sidewalls of each of the plurality of semiconductor layers and the corresponding first gate section are in direct contact with each other.

5. The semiconductor device of claim 3, further comprising a connected layer disposed between the sidewalls of each of the plurality of semiconductor layers and the corresponding first gate section, wherein the connecter layer includes a material that has an etching selectivity with respect to a material of the plurality of semiconductor layers.

6. The semiconductor device of claim 5, wherein the connecter layer includes a material selected from the group consisting of: SiGeO, SiO, SiGeN, SiN, SiGeS, and SiS.

7. The semiconductor device of claim 2, wherein the plurality of arcs of the second curvature-based profile each curve inwardly toward the plurality of second gate sections.

8. The semiconductor device of claim 2, wherein each of the plurality of semiconductor layers has sidewalls extending along the first direction, and wherein an angle between a projection of each of the sidewalls and any one of the plurality of arcs of the second curvature-based profile is less than 90 degrees.

9. The semiconductor device of claim 1, wherein each of the plurality of second gate sections is vertically disposed between adjacent ones of the plurality of semiconductor layers, and wherein each of the plurality of second gate sections has ends that each extend along the second lateral direction.

10. A semiconductor device, comprising:
a plurality of semiconductor layers vertically separated from one another, wherein each of the plurality of semiconductor layers extends along a first lateral direction;
a gate structure that extends along a second lateral direction, wherein the gate structure comprises a plurality of first gate sections and a plurality of second gate sections, and wherein the plurality of first gate sections are laterally aligned with the plurality of semiconductor layers, respectively, and the plurality of second gate sections are each vertically disposed between adjacent ones of the plurality of semiconductor layers; and
an inner spacer comprising a first group and a second group;
wherein each of the first group of the inner spacer contacts a first end of a corresponding one of the plurality of first gate sections, and each of the second group of the inner spacer contacts a second end of a corresponding one of the plurality of second gate sections; and
wherein the first end has a single arc, and the second end has a plurality of arcs connected to one another.

11. The semiconductor device of claim 10, wherein each of the plurality of semiconductor layers has sidewalls extending along the first direction, and wherein an angle between a portion of each of the sidewalls that is wrapped by a corresponding one of the plurality of first gate sections and the single arc is less than 90 degrees.

12. The semiconductor device of claim 10, wherein each of the plurality of semiconductor layers has sidewalls extending along the first direction, and wherein an angle between a projection of each of the sidewalls and any one of the plurality of arcs is less than 90 degrees.

13. The semiconductor device of claim 10, wherein the single arc curves inwardly toward a corresponding one of the plurality of first gate sections.

14. The semiconductor device of claim 10, wherein the plurality of arcs each curve inwardly toward a corresponding one of the plurality of second gate sections.

15. The semiconductor device of claim 10, wherein each of the plurality of semiconductor layers has sidewalls extending along the first direction, the semiconductor device further comprising a connected layer disposed between the sidewalls of the plurality of semiconductor layers and the plurality of first gate sections.

16. The semiconductor device of claim 15, wherein the connecter layer includes a material that has an etching selectivity with respect to a material of the plurality of semiconductor layers.

17. The semiconductor device of claim 15, wherein the connecter layer includes a material selected from the group consisting of: SiGeO, SiO, SiGeN, SiN, SiGeS, and SiS.

18. The semiconductor device of claim 10, wherein each of the plurality of semiconductor layers has sidewalls extending along the first direction, and wherein the sidewalls of the plurality of semiconductor layers are in direct contact with the plurality of first gate sections.

19. A semiconductor device, comprising:
a plurality of semiconductor layers vertically separated from one another, each of the plurality of semiconductor layers extending along a first lateral direction between a first source/drain structure and a second source/drain structure;
a gate structure extending along a second lateral direction and comprising at least a lower portion that wraps around each of the plurality of semiconductor layers; and
an inner spacer disposed between the lower portion of the gate structure and the first or second source/drain structure, and comprising a first group and a second group;
wherein each of the first group of the inner spacer contacts a first end of a corresponding one of the plurality of first gate sections, and each of the second group of the inner spacer contacts a second end of a corresponding one of the plurality of second gate sections; and
wherein the first end has a single arc, and the second end has a plurality of arcs connected to one another.

20. The semiconductor device of claim 19, wherein each of the plurality of semiconductor layers has sidewalls extending along the first direction, wherein a first angle between a portion of each of the sidewalls that is wrapped by a corresponding one of the plurality of first gate sections and the single arc is less than 90 degrees, and wherein a second angle between a projection of each of the sidewalls and any one of the plurality of arcs is less than 90 degrees.

* * * * *